(12) United States Patent
Kwon et al.

(10) Patent No.: US 9,856,564 B2
(45) Date of Patent: Jan. 2, 2018

(54) IMAGE PROCESSING-BASED LITHOGRAPHY SYSTEM AND METHOD OF COATING TARGET OBJECT

(71) Applicant: SNU R&DB FOUNDATION, Seoul (KR)

(72) Inventors: Sunghoon Kwon, Seoul (KR); Sueun Chung, Seoul (KR); Seungah Lee, Gyeonggi-do (KR); Jisung Jang, Seoul (KR); Sangkwon Han, Incheon (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 15/008,995

(22) Filed: Jan. 28, 2016

(65) Prior Publication Data

US 2016/0145744 A1  May 26, 2016

Related U.S. Application Data

(63) Continuation of application No. 13/433,938, filed on Mar. 29, 2012, now Pat. No. 9,323,159, which is a
(Continued)

(30) Foreign Application Priority Data

Sep. 30, 2009 (KR) .................. 10-2009-0093027
Jan. 20, 2010 (KR) .................. 10-2010-0005094

(51) Int. Cl.
*G03B 27/42* (2006.01)
*C23C 16/52* (2006.01)
(Continued)

(52) U.S. Cl.
CPC ............... *C23C 16/52* (2013.01); *G03F 7/16* (2013.01); *G03F 7/2057* (2013.01); *G03F 7/705* (2013.01);
(Continued)

(58) Field of Classification Search
CPC ............... G03F 7/70291; G03F 7/2051; G03F 7/70508; G03F 7/20; G03F 7/704;
(Continued)

(56) References Cited

U.S. PATENT DOCUMENTS 6,967,708 B1  11/2005 Yokoyama et al.
7,440,078 B2  10/2008 Bleeker et al.
(Continued)

FOREIGN PATENT DOCUMENTS

KR  10-2007-0065848 A  6/2007
KR  10-2008-0080883 A  9/2008
(Continued)

*Primary Examiner* — Mesfin Asfaw
(74) *Attorney, Agent, or Firm* — Paratus Law Group, PLLC

(57) ABSTRACT

A technique related with a lithography system is disclosed. The lithography system includes at least one target object disposed on a substrate, a processor configured to process an image of the target object to determine an optical pattern for a coating layer of the target object, and an exposure apparatus configured to provide light having the optical pattern determined by the processor to the substrate.

16 Claims, 22 Drawing Sheets

Related U.S. Application Data continuation of application No. PCT/KR2010/006602, filed on Sep. 29, 2010.

(51) Int. Cl.
  *G03F 7/20* (2006.01)
  *G03F 9/00* (2006.01)
  *H01L 21/56* (2006.01)
  *G03F 7/16* (2006.01)

(52) U.S. Cl.
  CPC ........ *G03F 7/7085* (2013.01); *G03F 7/70291* (2013.01); *G03F 7/70466* (2013.01); *G03F 7/70483* (2013.01); *G03F 7/70525* (2013.01); *G03F 7/70625* (2013.01); *G03F 9/00* (2013.01); *H01L 21/561* (2013.01)

(58) Field of Classification Search
  CPC ........ G03F 7/70391; G03F 7/705; G03F 1/36; G03F 7/70116; G03F 1/144; G03F 7/70383; G03F 2007/2067; G03F 7/2022; H01L 21/67253
  See application file for complete search history.

(56) References Cited

U.S. PATENT DOCUMENTS

| | | | |
|---|---|---|---|
| 2005/0105071 A1 | 5/2005 | Ishii | |
| 2005/0245078 A1* | 11/2005 | Ohnuma | H01L 27/1292 438/672 |
| 2006/0082752 A1* | 4/2006 | Bleeker | G03F 7/70291 355/69 |
| 2008/0210888 A1 | 9/2008 | Inoue et al. | |
| 2009/0263736 A1 | 10/2009 | Inoue et al. | |
| 2010/0002210 A1* | 1/2010 | Hendel | G03F 7/70408 355/53 |
| 2010/0276716 A1* | 11/2010 | Kwon | H01L 33/44 257/98 |

FOREIGN PATENT DOCUMENTS

| | | |
|---|---|---|
| KR | 10-2008-0107744 A | 12/2008 |
| KR | 10-2009-0076101 A1 | 7/2009 |
| WO | WO 2007/058188 A1 | 5/2007 |
| WO | WO 2008/150140 A2 | 12/2008 |

\* cited by examiner

IMAGE PROCESSING-BASED LITHOGRAPHY SYSTEM AND METHOD OF COATING TARGET OBJECT

CROSS-REFERENCE TO RELATED APPLICATIONS

This Non-Provisional Patent Application is a Continuation of U.S. patent application Ser. No. 13/433,938 filed on Mar. 29, 2012, which is a Continuation of PCT/KR2010/006602 filed on Sep. 29, 2010, which claims priority to Korean Patent Application Nos. 10-2009-0093027 filed on Sep. 30, 2009 and 10-2010-0005094 filed on Jan. 20, 2010, which are all hereby incorporated by reference in their entirety.

BACKGROUND

The present disclosure generally relates to a lithography system, and more particularly, to an image processing-based lithography system and a method of coating a target object.

A lithography system is an apparatus used to form a desired pattern on a substrate. An exposure process using the lithography system is an essential part of a semiconductor process. A desired pattern may be formed on a substrate using an exposure process. To form the desired pattern on the substrate, a photomask on which a pattern is formed may be employed. Since the pattern formed on the photomask is fixed as a specific pattern, the photomask should be replaced with a new photomask to form a new pattern on the substrate. In a semiconductor process, frequent changes of photomasks may lead to increased fabrication cost and reduced throughput. Accordingly, a new lithography system that is cost-effective and highly productive is required.

In addition, a packaging (e.g., coating) process, which is cost-effective for small-sized chips, significantly affects the integrated circuit (IC) industry. Presently, commercially available radio-frequency identifications (RFIDs) and light-emitting devices (LEDs) have a chip size of about 200 µm or less. A pick-and-place technique is being applied in the production of small-sized chips. As the number of chips fabricated on a single semiconductor wafer increases, the pick-and-place technique causes a lower processing speed, lower throughput, and higher cost. Accordingly, a new process that is highly cost-effective and increases processing speed and throughput is needed.

SUMMARY

According to an exemplary embodiment, a lithography system is disclosed. The lithography system includes at least one target object disposed on a substrate, a processor configured to process an image of the target object and determine an optical pattern for a coating layer of the target object, and an exposure apparatus configured to provide the optical pattern determined by the processor to the substrate.

According to another exemplary embodiment, a method of coating a target object is provided. The method includes preparing a substrate having one surface on which at least one target object is disposed, determining an optical pattern for a coating layer of the target object by processing an image of the target object, and providing light having the determined optical pattern to the substrate.

According to another exemplary embodiment, a method of coating a target object is provided. The method includes preparing a substrate having one surface on which at least one target object is disposed, forming photoresist on at least a portion of surfaces of the substrate and the target object, forming a perimeter wall for a coating layer of the target object by processing an image of the target object, and providing a resin to the substrate and at least the partial region of the surface of the target object surrounded by the perimeter wall.

According to another exemplary embodiment, a method of coating a chip is provided. The method includes preparing a plurality of chips disposed on a flexible substrate, the plurality of chips having a first arrangement on the substrate, changing the first arrangement into a second arrangement by deforming the flexible substrate, forming photoresist on at least a portion of surfaces of the substrate and the plurality of chips, and forming a first coating layer on the surfaces of the plurality of chips by selectively exposing the photoresist to light. The first coating layer is the cured photoresist.

According to another exemplary embodiment, a chip coating system is provided. The system includes a flexible substrate having one surface on which a plurality of chips having a first arrangement are disposed, a fixture connected to the flexible substrate and configured to deform the flexible substrate to convert the first arrangement into a second arrangement, a first coater configured to be capable of forming photoresist on at least a portion of surfaces of the substrate and the plurality of chips, and a lithography system configured to be capable of forming a coating layer on the surfaces of the plurality of chips by selectively exposing the photoresist to light. The coating layer is the cured photoresist.

The above paragraphs constitute a somewhat simplified abstraction of the subject matter of the following detailed description. They are not intended to specify major or essential features of the invention or to limit the scope appended claims.

BRIEF DESCRIPTION OF THE DRAWINGS

The above and other features and advantages of the present disclosure will become more apparent to those of ordinary skill in the art by describing in detail example embodiments thereof with reference to the attached drawings in which.

DETAILED DESCRIPTION

Figure 1:
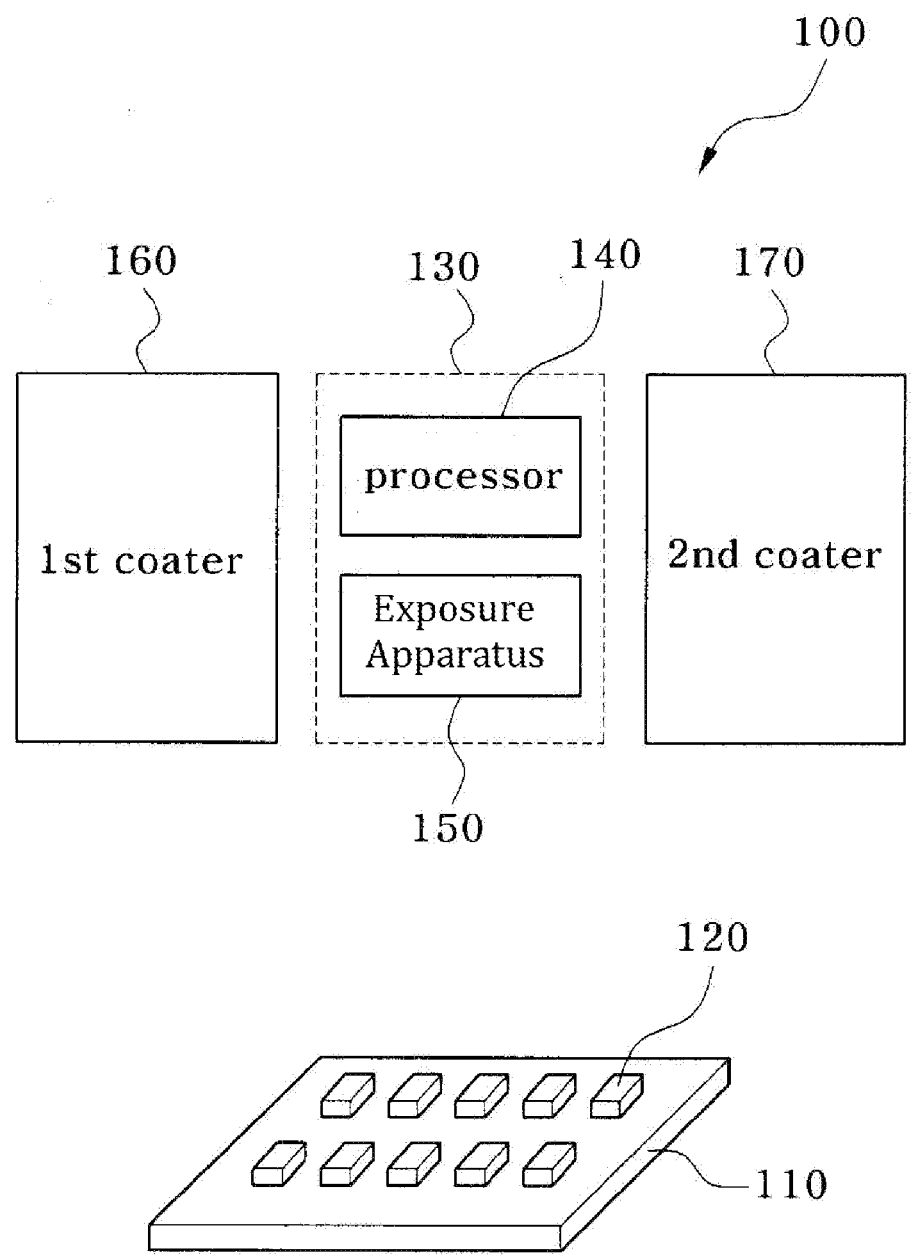
FIG. 1 is a diagram of a lithography system according to an exemplary embodiment.

Hereinafter, exemplary embodiments of the present disclosure will be described in detail with reference to the accompanying drawings. As long as not clearly stated otherwise in the disclosure, like numerals in the drawings denote like elements. However, the exemplary embodiments described herein are not intended to limit the present disclosure, which may include different embodiments. In other words, the exemplary embodiments may be modified without departing from the scope of the present disclosure. It should be easily understood by one of ordinary skill in the art that the elements of the present disclosure, that is, the elements generally described and shown in the drawings, may be arranged, configured, connected and designed in various different ways, while still falling within the scope and inventive spirit of the present disclosure. In the drawings, the widths, lengths, thicknesses, or shapes of layers or regions may be exaggerated for clarity.

It will be understood that when an element or layer is referred to as being "disposed in" or "formed in" another element or layer, it can be directly disposed or formed in the other element or layer or intervening elements or layers may be present.

It will be understood that when an element or layer is referred to as being "on" another element or layer, it can be directly on the other element or layer or intervening elements or layers may be present.

A term "coating layer" used in the present specification not only refers to a thin layer having a uniform thickness disposed on a target object but also may be used as a concept including a 3-dimensional structure having an arbitrary shape disposed on the target object. The 3-dimensional structure may be, for example, a thin layer of variable thickness, a microlens, a microrail, or a protrusion. In addition to these examples, any other 3-dimensional structure of arbitrary shape that may be formed using an image processing-based lithography system according to the present disclosure may be used as the "coating layer".

FIG. 1 is a diagram of a lithography system according to an exemplary embodiment. Referring to FIG. 1, a lithography system 100 includes a substrate 110, at least one target object 120, and an image processing-based exposure system 130. The image processing-based exposure system 130 includes a processor 140 and an exposure apparatus 150. In other embodiments, the lithography system 100 may optionally further include a first coater 160. In still other embodiments, the lithography system 100 may optionally further include a second coater 170.

At least one target object 120 is disposed on the substrate 110. Various kinds of substrates may be used as the substrate 110. The substrate 110 may be, for example, a semiconductor substrate (e.g., a silicon substrate), a glass substrate, a plastic substrate, or a circuit substrate (e.g., a printed circuit board (PCB)). In the drawing, for example, a semiconductor substrate is illustrated as the substrate 110. In other embodiments, a flexible substrate may be used as the substrate 110.

The flexible substrate may be, for example, a plastic substrate, a plastic film, or a flexible PCB. When a flexible substrate is used as the substrate 110, the flexible substrate may be deformed due to external force. In this case, arrangement of the at least one target object 120 disposed on the substrate 110 may be changed. The external force may be tensile force or compressive force applied to the substrate 110. That is, a horizontal interval (e.g., an X-axial interval) or a vertical interval (e.g., a Y-axial interval) between target objects 120 disposed on the substrate 110 may be changed due to the external force.

Various target objects may be used as the target object 120. For example, the target object 120 may be a microchip. The microchip may be a chip having an area of less than 1 $mm^2$. For example, the microchip may have a size of 10 $\mu m \times 10 \, \mu m \times 20 \, \mu m$. In another example, the target object 120 may be a semiconductor chip. The semiconductor chip may be, for example, at least one chip selected from a light emitting device (LED) chip, a radio-frequency identification (RFID) chip, a complementary-metal-oxide-semiconductor (CMOS) chip, and a combination thereof. The chip selected from the microchip, the LED chip, the RFID chip, the CMOS chip, and a combination thereof may be fabricated on a semiconductor wafer using a semiconductor process. In another example, the target object 120 may be a microstructure. The microstructure may be at least one selected from a cell, a semiconductor nanoparticle, a typical nanoparticle, an inorganic structure, a heterogeneous polymer bead, a microparticle, a microstructure, and a combination thereof. In addition to these examples, various objects may be used as the target object 120.

The image processing-based exposure system 130 includes the processor 140 and the exposure apparatus 150. The processor 140 processes an image of the target object 120 and determines an optical pattern for a coating layer of the target object 120. The processor 140 may be, for example, a computer vision system. In one exemplary embodiment, the processor 140 may include a camera (not shown) and an image processor (not shown). The exposure apparatus 150 provides light having the optical pattern determined by the processor 140 to the substrate 110. In one exemplary embodiment, the exposure apparatus 150 may include a light source (not shown) and a spatial light modulator (not shown). The spatial light modulator may modulate the light provided by the light source in response to a signal provided by the processor 140. A detailed description of the image processing-based exposure system 130 including the processor 140 and the exposure apparatus 150 will be presented with reference to FIG. 2.

The first coater 160 may supply photoresist (not shown) to at least a portion of surfaces of the substrate 110 and the target object 120. Various apparatuses may be used as the first coater 160. The first coater 160 may be, for example, a spin coater or a spray coater. In another example, the first coater 160 may include a microfluidic channel (not shown). The microfluidic channel may surround the target object 120. In this case, the photoresist may be supplied to the microfluidic channel, so that at least the partial region of the surfaces of the substrate 110 and the surface of the target object 120 may be supplied with the photoresist. Various kinds of materials may be used for the microfluidic channel. The material of the microfluidic channel may be, for example, a polymer compound (e.g., poly-dimethyl siloxane (PDMS)). In some embodiments, the microfluidic channel may further include an inlet tube (not shown) and an outlet tube (not shown) required to respectively inject and discharge the photoresist. In this case, a space between the microfluidic channel and the substrate 110 may be surrounded by the microfluidic channel and the substrate 110 and connected to an external space only by the inlet tube and the outlet tube. An inner wall of the microfluidic channel may further include an oxygen inhibition layer (not shown). A photocurable liquid that contacts the oxygen inhibition layer is not cured by light (e.g., UV light). Accordingly, the oxygen inhibition layer serves as an anti-adhesion layer. In addition to these examples, various other apparatuses may be used (as the first coater 160).

Various kinds of photoresist materials may be used as the photoresist. The photoresist may be positive resist or negative resist. For example, the photoresist may not include a phosphor. In this case, the cured photoresist may be, for example, used as a transparent layer or a molding layer. In another example, the photoresist may include a phosphor. In this case, the cured photoresist may be, for example, used as a phosphor layer. Various kinds of phosphors may be used as the phosphor. The phosphor may be, for example, one selected from a red phosphor, a green phosphor, a blue phosphor, a yellow phosphor, and a combination thereof. When an LED chip is used as the target object 120, light having various colors or white light having various color temperatures may be embodied by controlling the optical wavelength and light intensity of the LED chip and the kind and concentration of the phosphor. The color temperature indicates that the color change of emitted light, which is shown depending on temperature, is stated in the unit of absolute temperature, Kelvin (K), based on the white color.

The second coater 170 may form a conductive layer or an insulating layer on at least a portion of the surfaces of the substrate 110 and the target object 120. Various apparatuses may be used as the second coater 170. The second coater 170 may be, for example, a spin coater, a spray coater, a physical vapor deposition (PVD) apparatus, a chemical vapor deposition (CVD) apparatus, or an electroplating apparatus. In addition to these examples, various other apparatuses may be used as the second coater 170. In other embodiments, when only the photoresist is used, the second coater 170 may be omitted.

Figure 2:
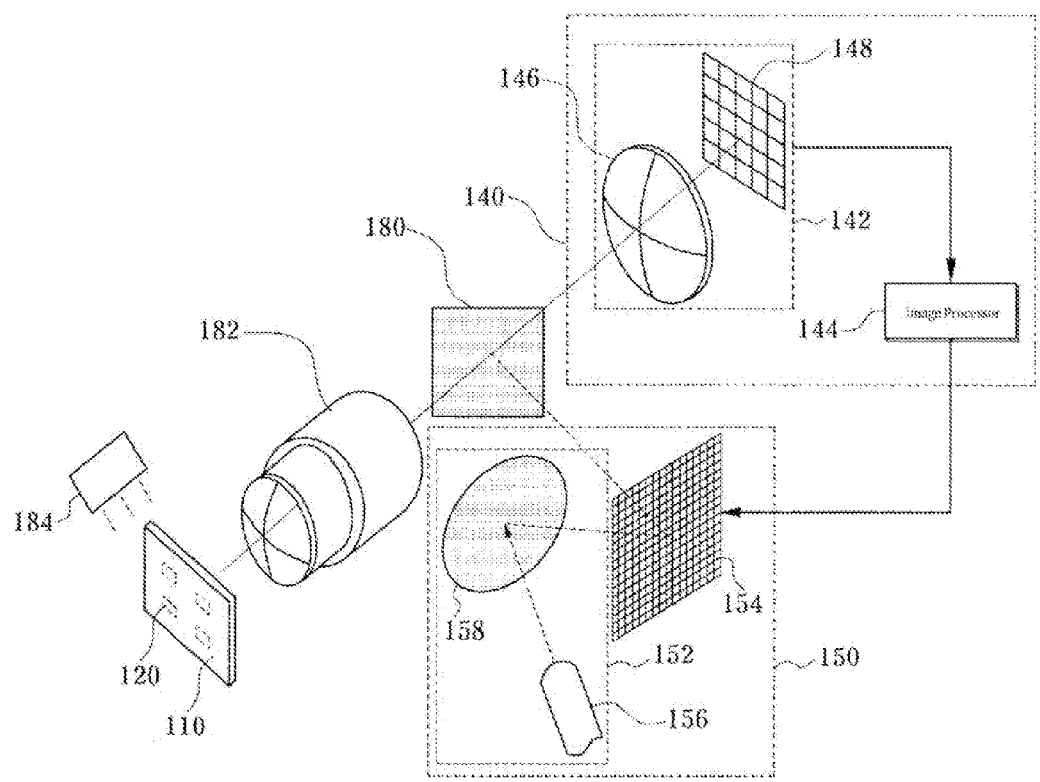
FIG. 2 is a diagram of an image processing-based exposure system according to an exemplary embodiment.

FIG. 2 is a diagram of an image processing-based exposure system according to an exemplary embodiment. Referring to FIG. 2, an image processing-based exposure system includes a processor 140 and an exposure apparatus 150. In other embodiments, the image processing-based exposure system 130 may optionally further include a beam splitter 180, a demagnification lens 182, and an illuminator 184.

The processor 140 processes an image of a target object 120 and determines an optical pattern for a coating layer of the target object 120. The processor 140 may be, for example, a computer vision system. FIG. 2 illustrates, for example, that the processor 140 includes a camera 142 and an image processor 144. The camera 142 captures the image of the target object 120 and provides an electric signal corresponding to the captured image of the target object 120 to the image processor 144. The image of the target object 120 captured by the camera 142 may be a moving image or a still image. For example, the camera 142 may convert light reflected by the target object 120 into an analog electric signal. For example, the camera 142 may include an imaging lens 146 and an image sensor 148. The imaging lens 146 functions to receive light from the beam splitter 180 and transmit the light to the image sensor 148, and enables formation of an image on the image sensor 148. The image sensor 148 functions to generate the electric signal corresponding to incident light. Various sensors may be used as the image sensor 148. The image sensor 148 may be, for example, a photodiode, a phototransistor, or a charge-coupled device (CCD).

The image processor 144 determines an optical pattern appropriate for a coating layer of the target object 120 based on the image of the target object 120 captured by the camera 142. The image processor 144 may be, for example, a personal computer (PC) or a lap-top computer. For instance, the image processor 144 may include a sampler and a quantizer configured to sample and quantize the electric signal provided by the camera 142.

The exposure apparatus 150 provides light having the optical pattern determined by the processor 140 to the substrate 110. In one exemplary embodiment, the exposure apparatus 150 may include a light source 152 and a spatial light modulator 154. The light source 152 may be, for example, an ultraviolet (UV) light source or a visible light source. The light source 152 may be, for example, a UV light source collimator 156 and a UV filter 158. The UV light source collimator 156 functions to output collimated UV light. For example, the UV light source collimator 156 may include a 200 W UV lamp (not shown) and a fiber-based light-guiding system (not shown). The UV filter 158 functions to selectively pass UV light from the UV light source collimator 156 to the spatial light modulator 154. The spatial light modulator 154 may modulate the light provided by the light source 152 in response to a signal provided by the processor 140. For example, the spatial light modulator 154 may be a digital micromirror array fabricated as a 2-dimensional array, as shown in FIG. 2. Alternatively, the spatial light modulator 154 may be fabricated as a 1-dimensional array different from the type illustrated in the drawing. Also, the spatial light modulator 154 may be fabricated using techniques other than the micromirror technique (e.g., a liquid crystal display (LCD) technique) different from the manner illustrated in the drawing. A light modulation operation of the spatial light modulator 154 may be programmed. That is, the spatial light modulator 154 may optionally transmit light incident on a desired pixel of the spatial light modulator 154 to the substrate 110 at a desired time.

The beam splitter 180 functions to transmit the modulated light provided by the exposure system 150 through the demagnification lens 182 to the substrate 110. Also, the beam splitter 180 functions to transmit an image, which is transmitted from the substrate 110 through the demagnification lens 182, to the camera 142. For example, the beam splitter 180 may be a half-mirror as shown in FIG. 2.

The demagnification lens 182 functions to demagnify light provided by the exposure system 150 and provide the demagnified light to the substrate 110. A microscopic object lens having various magnifications of 2×, 4×, 10×, 20×, 40×, and 60× may be used as the demagnification lens 182. For example, a 10× microscopic object lens may be used as the demagnification lens 182 to project an image of the exposure system 150 on a final object plane with a demagnification factor of about 8.9.

The illuminator 184 functions to provide illumination so that the camera 142 can obtain the image of the substrate 110. Since there is only a small difference in refractive index between cured photoresist (not shown) and uncured photoresist (not shown), off-axis illumination is preferably used to show the cured photoresist.

Referring back to FIGS. 1 and 2, the lithography system 100 according to the present disclosure includes the image processing-based exposure system 130. The image processing-based exposure system 130 may process an image of the target object 120 and determine an optical pattern for a coating layer of the target object 120. The optical pattern may be programmed by the processor 140. In a semiconductor process, frequent changes of photomasks may increase fabrication cost and reduce throughput. The use of the lithography system 100 according to the present disclosure does not involve changes of photomasks to form new patterns. Accordingly, a new lithography system, which is cost-effective and highly productive, may be obtained. Furthermore, the lithography system 100 according to the present disclosure may form a 3-dimensional coating layer having an arbitrary shape on the surface of the target object 120 without using a photomask.

Figure 3:
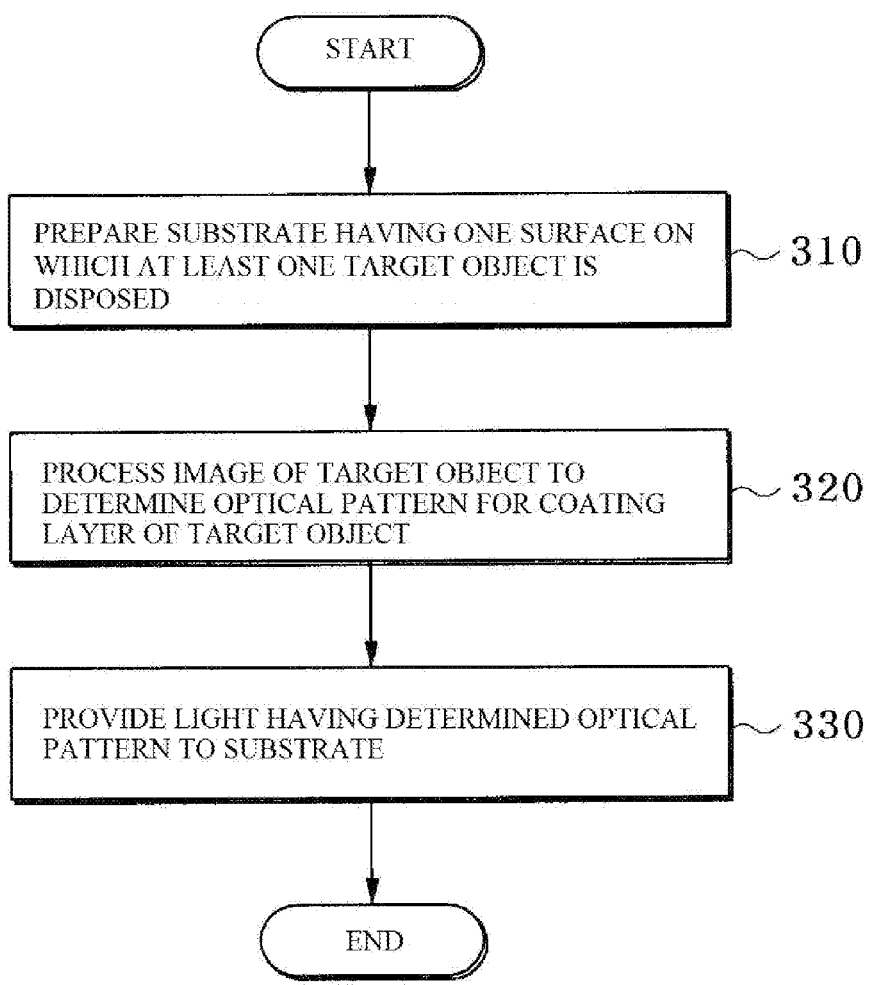
FIG. 3 is a flowchart illustrating a method of coating a target object according to an exemplary embodiment.

FIG. 3 is a flowchart illustrating a method of coating a target object according to an exemplary embodiment. Referring to FIG. 3, the method of coating a target object starts from block 310. In block 310, a substrate having one surface on which at least one target object is disposed is prepared. In block 320, an image of the target object is processed to determine an optical pattern for a coating layer of the target object. In one embodiment, the process of determining the optical pattern may include obtaining the image of the target object and converting the obtained image of the target object into a black-and-white image. In block 330, light having the determined optical pattern is provided to the substrate. In one embodiment, providing the light having the determined optical pattern to the substrate may include providing a light source and modulating light provided by the light source based on the optical pattern.

In other embodiments, the method of coating a target object may optionally further include forming photoresist on at least a portion of surfaces of the substrate and the target object. The photoresist is optionally cured by the light having the determined optical pattern. In one embodiment, the formation of the photoresist may include forming the photoresist on the at least a portion of the surfaces of the substrate and the target object using a microfluidic channel containing the photoresist therein. In this case, the thickness of the cured photoresist disposed on a top surface of the target object may be controlled according to a distance between an inner lateral surface of the microfluidic channel and the top surface of the target object.

In other embodiments, the method of coating a target object may be performed before the formation of the photoresist and further include forming an additional coating layer on at least a portion of the surface of the target object. Also, the method of coating a target object may be performed after the formation of the additional coating layer and further include selectively etching the additional coating layer to form a pattern. In this case, a coating layer formed by light provided during the processes described with reference to blocks 320 and 330 may be used as an etching mask required for the selective etching of the additional coating layer. The coating layer may be cured photoresist. The etching of the additional coating layer may be a dry etching or wet etching process typically used in the semiconductor process. Various materials may be used for the additional coating layer. For example, the additional coating layer may be a conductive layer. In another example, the additional coating layer may be an insulating layer.

In other embodiments, the method of coating a target object may be performed after the preparation of the substrate and further include changing arrangement of the target object. In this case, a flexible substrate may be used as the substrate. The flexible substrate may be deformed using various methods. In one embodiment, tensile force may be applied to the flexible substrate in at least one selected from an X-direction, a Y-direction, and a combination thereof to stretch the substrate, so that the flexible substrate may be deformed. In other embodiments, compressive force may be applied to the flexible substrate in at least one selected from the X-direction, the Y-direction, and a combination thereof to compress the substrate, so that the flexible substrate may be deformed. The compressive force may be not only externally applied compressive force but also restoring force of the flexible substrate. The restoring force may correspond to the tensile strength applied to the flexible substrate. In addition, the flexible substrate may be deformed using various other methods. Hereinafter, a method of coating a target object according to an exemplary embodiment will be described in detail with reference to FIGS. 4A through 6C.

FIGS. 4A through 6C are diagrams illustrating a method of coating a target object according to an exemplary embodiment.

Figure 4A:
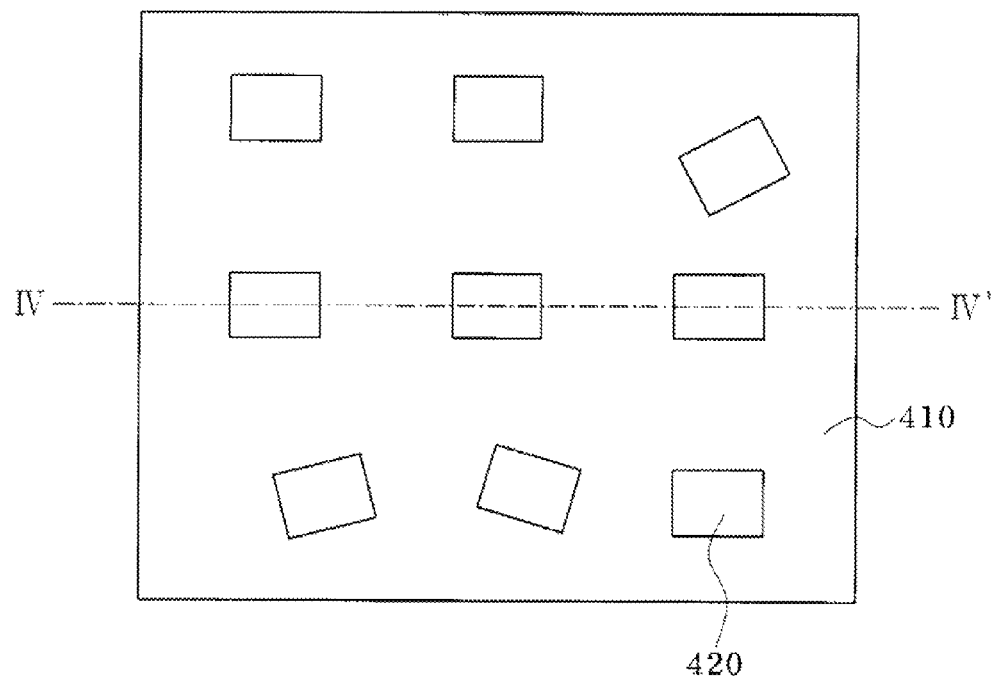
FIGS. 4A through 6C are diagrams illustrating a method of coating a target object according to an exemplary embodiment.
Figure 4B:

Referring to FIGS. 4A and 4B, to begin with, a substrate 410 having one surface on which at least one target object 420 is disposed is prepared. FIGS. 4A and 4B are a plan view and cross-sectional view, respectively. The cross-sectional view of FIG. 4B is taken along line IV-IV' of the plan view of FIG. 4A. When a flexible substrate is used as the substrate 410, the flexible substrate may be deformed due to external force. In this case, the arrangement of the at least one target object 420 disposed on the substrate 410 may be changed. Since the substrate 410 and the target object 420 are respectively substantially the same as the substrate 110 and the target object 120 described above with reference to FIG. 1, a detailed description thereof will be omitted for brevity. For clarity, it will be assumed hereinafter that a semiconductor chip is used as the target object 420. However, a method of coating the target object 420 is not limited to specific types or specific target objects.

Figure 5A:
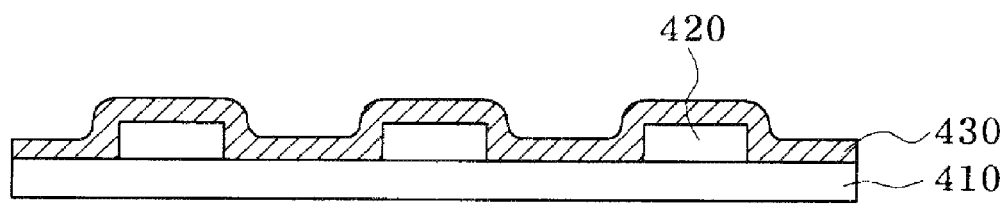
Figure 5B:
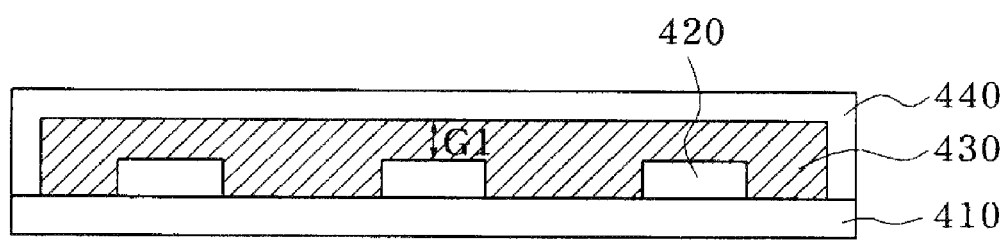
Figure 5C:
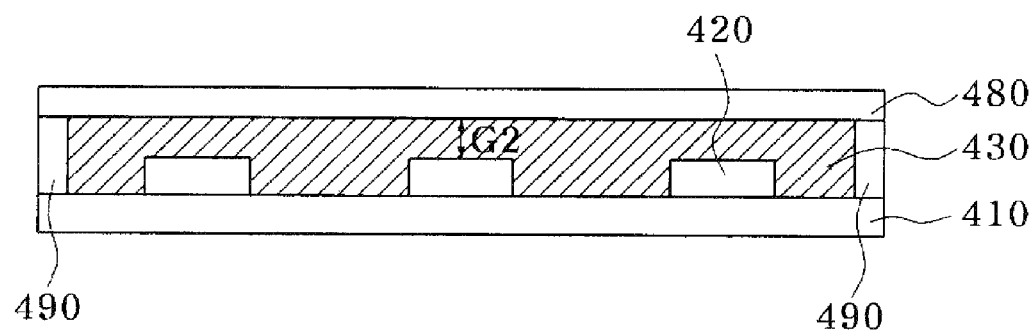

Referring to FIGS. 5A through 5C, photoresist 430 is formed on at least a portion of surfaces of the substrate 410 and the target object 420. FIGS. 5A through 5C are cross-sectional views. Referring to FIG. 5A, the photoresist 430 may be formed on at least a portion of surfaces of the substrate 410 and the target object 420 using a coating process typically used in the semiconductor process. FIGS. 5A through 5C illustrate, for example, the photoresist 430 formed on the surface of the target object 420 to a uniform thickness. Alternatively, photoresist 430 having a large thickness deviation may be formed on the surface of the target object 420. The coating process may be, for example, a spin coating process or a spray coating process. In one exemplary embodiment, when the spin coating process is used as the coating process, the thickness of the photoresist 430 formed on a top surface of the target object 420 may be controlled according to the kind of photoresist, a spin coating time, and a spin coating speed. In another exemplary embodiment, when the spray coating process is used as the coating process, the thickness and thickness deviation of the photoresist 430 disposed on the top surface of the target object 420 may be controlled by adjusting the kind of photoresist or a position of a spray unit. Referring to FIG. 5B, the photoresist 430 may be formed on at least a portion of surfaces of the substrate 410 and the target object 420 using a microfluidic channel 440 containing the photoresist therein. In this case, the thickness of the photoresist 430 disposed on a top surface of the target object 420 may be controlled according to a distance G1 between an inner lateral surface of the microfluidic channel 440 and the top surface of the target object 420. Referring to FIG. 5C, the photoresist 430 may be formed on at least a portion of surfaces of the substrate 410 and the target object 420 using a board 480 and spacers 490 containing photoresist therein.

In this case, a thickness of the photoresist 430 disposed on the top surface of the target object 420 may be controlled according to a distance G2 between an inner lateral surface of the board 480 and the top surface of the target object 420. FIG. 5C illustrates a planar board as the board 480. Alternatively, the board 480 may be an uneven board. The uneven board may be, for example, a board including a concave groove formed in an inner lateral surface thereof. The distance G2 between the inner lateral surface of the board 480 and the top surface of the target object 420 may be determined by the spacers 490. FIG. 5C illustrates, for example, that the spacers 490 are separated from the board 480. Alternatively, the spacers 490 may be integrally formed with the board 480. In other embodiments, when another unit capable of precisely controlling the distance between the board 480 and the top surface of the target object 420 is prepared, the spacers 490 may be omitted. The board 480 may include an inlet (not shown) and an outlet (not shown). The inlet corresponds to a hole through which the photoresist 430 is injected, and the outlet corresponds to a hole through which inner air may be emitted during the injection of the photoresist 430. In other embodiments, the inlet and outlet may be disposed in the spacers 490 or the substrate 410 or omitted. The inner lateral surface of the board 480 and walls of the spacers 490 disposed opposite the inner lateral surfaces of the board 480 may further include an oxygen inhibition layer (not shown). The photoresist 430 that contacts the oxygen inhibition layer is not cured by light (e.g., UV light). Accordingly, the oxygen inhibition layer functions as an anti-adhesion layer. In addition to this example, various other apparatuses may be used. The board 480 may be wholly or partially transparent. For example, the board 480 may be a glass board or a plastic board. The spacers 490 may be wholly or partially transparent. The spacers 490 may include, for example, glass or plastic.

Since the material and properties of the photoresist 430 and the microfluidic channel 440 are substantially the same as described above with reference to FIG. 1, a detailed description thereof will be omitted for brevity.

Figure 6A:
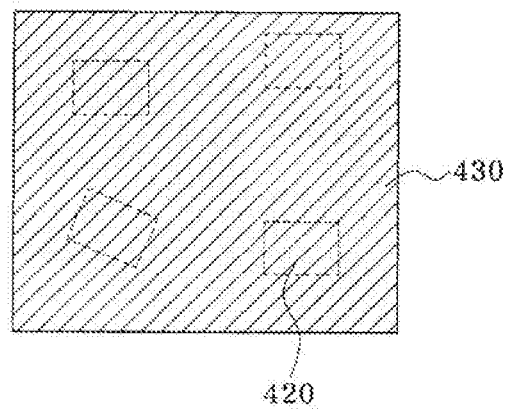
Figure 6B:
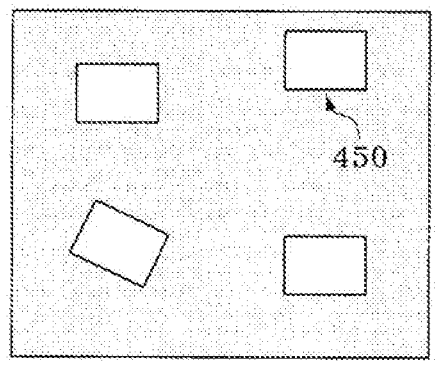
Figure 6C:
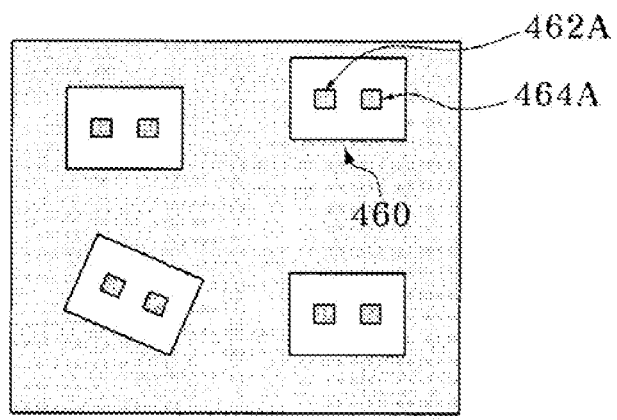

Referring to FIGS. 6A through 6C, an image of the target object 420 is processed to determine an optical pattern for a coating layer of the target object 420. For example, the optical pattern may be obtained by processing the image of the target object 420 using the processor 140 described above with reference to FIGS. 1 and 2. In this case, the optical pattern may be obtained based on the image of the target object 420 using various methods. In one embodiment, obtaining the optical pattern may include obtaining the image of the target object 420 and converting the obtained image of the target object 420 into a black-and-white image. FIG. 6A illustrates the substrate 410 and the target object 420 on which the photoresist 430 is formed. FIG. 6A illustrates, for example, the photoresist 430 surrounding the entire substrate 410 and target object 420. In other embodiments, the photoresist 430 may surround partial regions of the substrate 410 and the target object 420. For example, the photoresist 430 may not be formed on a top surface of the target object 420. FIG. 6B illustrates a black-and-white image 450 of the target object 420, and FIG. 6C illustrates an optical pattern 460 determined by processing the image 450 of the target object 420. The optical pattern 460 may further include optical patterns 462A and 464A of the top surface of the target object 420, which are required for a contact with a bonding wire. FIG. 6C illustrates, for example, that the optical patterns 462A and 464A required for the contact with the bonding wire are two regions having the same shape. In other embodiments, the optical patterns 462A and 464A required for the contact with the bonding wire may be provided in various other numbers or shapes. Edges and corners of the target object 420 are detected from the black-and-white image 450 of the target object 420, and a position and rotation angle of the target object 420 are calculated based on the detected edges and corners. The optical pattern 460 for the coating layer of the target object 420 may be obtained based on the calculated position and rotation angle of the target object 420. That is, the optical pattern 460 may be obtained by increasing or reducing the image 450 of the target object 420 within a predetermined range. Furthermore, the optical pattern 460 may be obtained by adding the optical patterns 462A and 464A required for the contact with the bonding wire.

Subsequently, light having the determined optical pattern 460 is provided to the substrate 410. In one embodiment, providing the light having the determined optical pattern 460 to the substrate 410 may include providing a light source and modulating light provided by the light source based on the determined optical pattern 460. The light having the determined optical pattern 460 may be provided to the substrate 410 using the image processing-based exposure system 130 described above with reference to FIGS. 1 and 2. Since providing the light having the determined optical pattern 460 to the substrate 410 can be inferred from the description provided with reference to FIGS. 1 and 2, a detailed description thereof will be omitted for brevity.

Figure 7A:
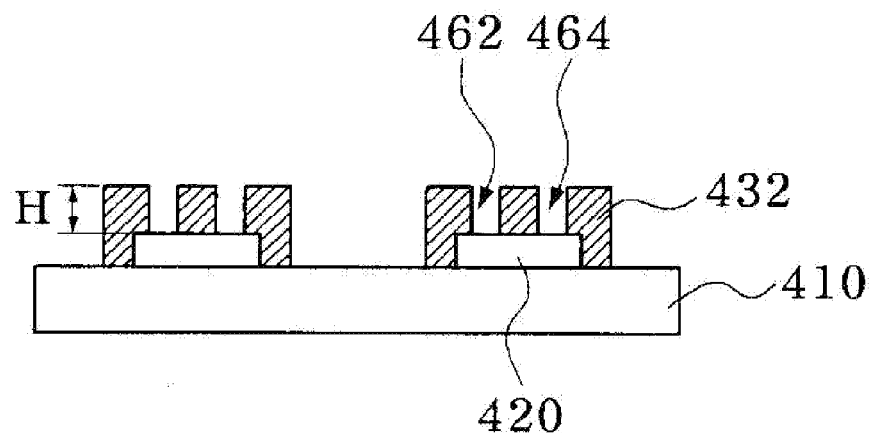
FIGS. 7A and 7B are cross-sectional views of target objects including coating layers formed using the method of coating a target object described with reference to FIGS. 4A through 6C.
Figure 7B:
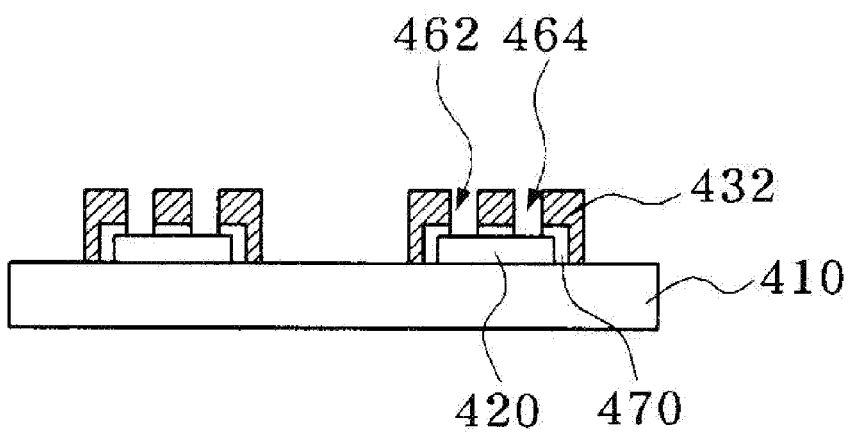

FIGS. 7A and 7B are cross-sectional views of target objects including coating layers formed using the method of coating a target object described with reference to FIGS. 4A through 6C.

Referring to FIG. 7A, a coating layer 432 is formed on surfaces of a substrate 410 and a target object 420 using the above-described method of coating a target object. Partial regions 462 and 464 of a top surface of the target object 420, which are required for a contact with a bonding wire, may not be covered with the coating layer 432. In other embodiments, when the top surface of the target object 420 does not need to contact the bonding wire, the partial regions 462 and 464 required for the contact with the bonding wire may be replaced by the coating layer 432. The coating layer 432 corresponds to cured photoresist 430. The thickness of the coating layer 432 may be controlled. In one embodiment, as shown in FIG. 5A, when the photoresist 430 is formed on the surface of the target object 420 using a spin coating process, the thickness of the coating layer 432 may be controlled according to the kind of the photoresist, a spin coating time, and a spin coating speed. In other embodiments, when a spray coating process is used as the coating process, the thickness and thickness deviation of the coating layer 432 disposed on the top surface of the target object 420 may be controlled by adjusting the kind of the photoresist and a position of a spray unit. In other embodiments, as shown in FIG. 5B, when the photoresist 430 is formed on the surface of the target object 420 using a microfluidic channel 440, assuming that the photoresist 430 neither expands nor contracts during a curing process, a thickness H of the coating layer 432 corresponds to a distance G between an inner lateral surface of the microfluidic channel 440 and the top surface of the target object 420.

Referring to FIG. 7B, a coating layer 432 is formed on surfaces of a substrate 410 and a target object 420 using the above-described method of coating a target object. In some embodiments, an additional coating layer 470 may be further formed on the surfaces of the substrate 410 and the target object 420. Partial regions 462 and 464 of a top surface of the target object 420, which are required for a contact with a bonding wire, may not be covered with the coating layer 432 and the additional coating layer 470. In other embodiments, when the top surface of the target object 420 does not need to contact the bonding wire, the partial regions 462 and 464 required for the contact with the bonding wire may be replaced by the coating layer 432 and the additional coating layer 470. Various materials may be used as the additional coating layer 470. For example, the additional coating layer 470 may be a conductive layer. In another example, the additional coating layer 470 may be an insulating layer.

FIG. 7B illustrates, for example, that the additional coating layer 470 is cured photoresist formed using the above-described method of coating a target object. For example, the additional coating layer 470 may include a phosphor. In this case, the additional coating layer 470 may be, for example, a phosphor layer. When an LED chip is used as the target object 420, the additional coating layer 470 including the phosphor may embody light having various colors or white light having various color temperatures along with the coating layer 432 including the phosphor. In another example, the additional coating layer 470 may not include a phosphor. In this case, the additional coating layer 470 may serve as, for example, a protection layer. The protection layer may form an appropriate space between the target object 420 and the coating layer 432. When an LED chip is used as the target object 420 and a phosphor layer is used as the coating layer 432, the space may function to protect the coating layer 432 from the influence of high heat generated by the LED chip.

In other embodiments, the additional coating layer 470 may be a coating layer patterned using the above-described method of coating a target object. Alternatively, the additional coating layer 470 may have various shapes or functions. For example, the additional coating layer 470 may be an interconnection line required for electrical connection. In another example, the additional coating layer 470 may be a contact pad required for a contact with the bonding wire. The method of coating a target object may be performed after the formation of the coating layer, and the additional coating layer 470 may be formed by selectively etching the coating layer using a pattern formed using the method of coating a target object. The formation of the additional coating layer 470 by selectively etching the coating layer may be performed using various methods. Since the methods of forming the additional coating layer 470 are apparent to those skilled in the art, a detailed description thereof will be omitted for brevity. The pattern corresponds to cured photoresist obtained using the method of coating a target object. For example, the coating layer may be a conductive layer. In other embodiments, the coating layer may be an insulating layer. The coating layer may be formed on at least a portion of a surface of the target object 420 using various methods. In another case, the coating layer may be formed on at least the partial region of the surface of the target object 420 using a PVD process, a CVD process, or an electroplating process. In addition to these examples, the coating layer may be formed using various other methods.

Figure 8:
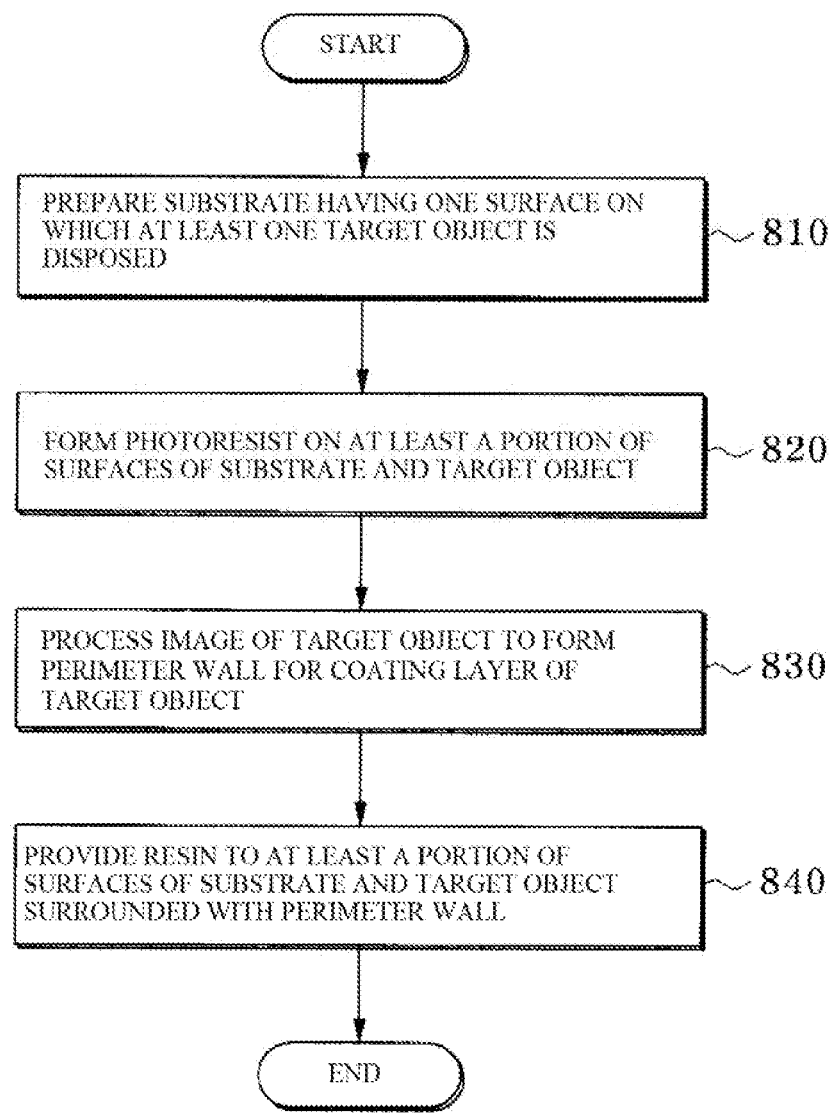
FIG. 8 is a flowchart illustrating a method of coating a target object according to another exemplary embodiment.

FIG. 8 is a flowchart illustrating a method of coating a target object according to another exemplary embodiment. Referring to FIG. 8, the method of coating a target object starts from block 810. In block 810, a substrate having one surface on which at least one target object is disposed is prepared. In block 820, photoresist is formed on at least a portion of surfaces of the substrate and the target object. In block 830, an image of the target object is processed to form a perimeter wall for a coating layer of the target object. In one embodiment, the formation of the perimeter wall may include obtaining the image of the target object and providing light having an optical pattern corresponding to the perimeter wall to the substrate using the obtained image of the target object. In block 840, resin is provided to at least the partial region of surfaces of the substrate and of the target object, which are surrounded by the perimeter wall. In one embodiment, the resin may include a phosphor.

In other embodiments, the method of coating a target object may be performed before the formation of the photoresist and further include forming an additional coating layer on at least a portion of the surface of the target object. Also, the method of coating a target object may be performed after the formation of the additional coating layer and further include selectively etching the additional coating layer to form a pattern. In this case, the coating layer formed due to light provided using the processes described with reference to blocks 320 and 330 of FIG. 3 may be used as an etching mask required for the selective etching of the additional coating layer. The coating layer may be cured photoresist. The etching of the additional coating layer may be a dry etching or wet etching process typically used in the semiconductor process. Various materials may be used for the additional coating layer. For example, the additional coating layer may be a conductive layer. In another example, the additional coating layer may be an insulating layer.

In other embodiments, the method of coating a target object may be performed after the preparation of the substrate and further include changing arrangement of the target object. In this case, a flexible substrate may be used as the substrate. The flexible substrate may be deformed using various methods. In one embodiment, the flexible substrate may be stretched by applying tensile force in at least one selected from an X-direction, a Y-direction, and a combination thereof. In other embodiments, the flexible substrate may be compressed by applying compressive force in at least one selected from the X-direction, the Y-direction, and a combination thereof. The compressive force may be not only externally applied compressive force but also restoring force of the flexible substrate. The restoring force may correspond to the tensile strength applied to the flexible substrate. In addition to these examples, the flexible substrate may be deformed using various other methods. Hereinafter, a method of coating a target object according to an exemplary embodiment will be described in detail with reference to FIGS. 9A through 13.

FIGS. 9A through 13 are diagrams illustrating a method of coating a target object according to another exemplary embodiment.

Figure 9A:
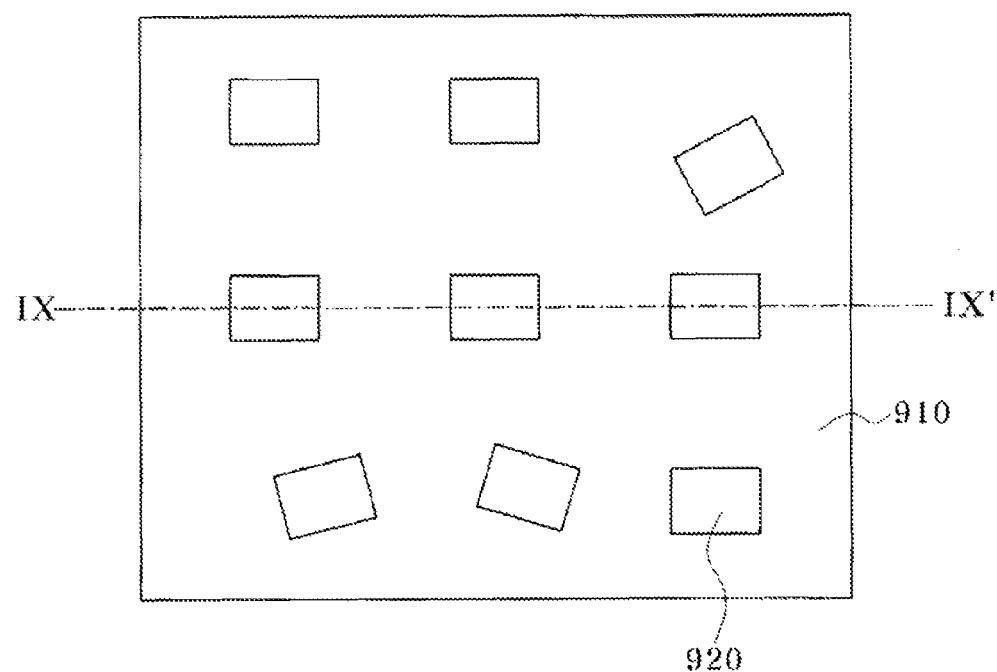
FIGS. 9A through 13 are diagrams illustrating a method of coating a target object according to another exemplary embodiment.
Figure 9B:
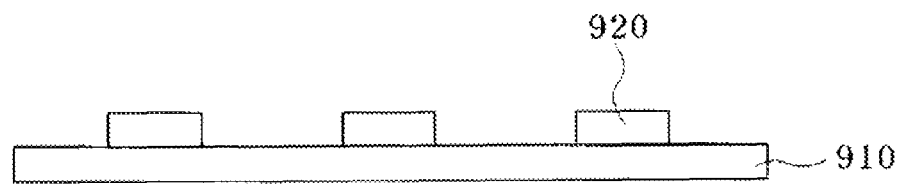

Referring to FIGS. 9A and 9B, to begin with, a substrate 910 having one surface on which at least one target object 920 is disposed is prepared. FIGS. 9A and 9B are a plan view and cross-sectional view, respectively. The cross-sectional view of FIG. 9B is taken along line IX-IX' of the plan view of FIG. 9A. When a flexible substrate is used as the substrate 910, the flexible substrate may be deformed due to external force. In this case, the arrangement of the at least one target object 920 disposed on the substrate 910 may be changed. Since the substrate 910 and the target object 920 are substantially the same as the substrate 110 and the target object 120 described above with reference to FIG. 1, a detailed description thereof will be omitted for brevity.

Figure 10A:
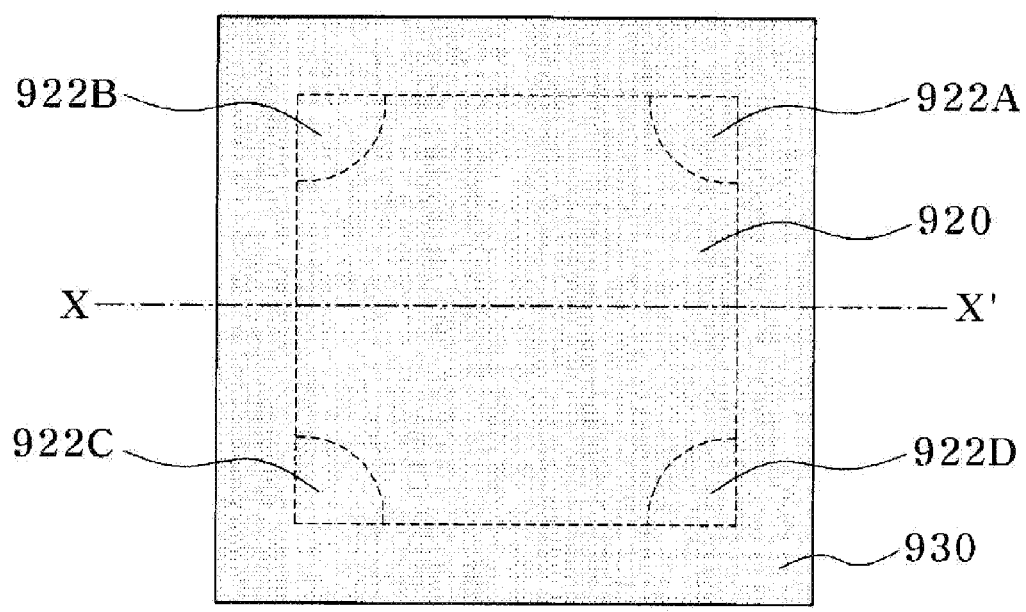
Figure 10B:
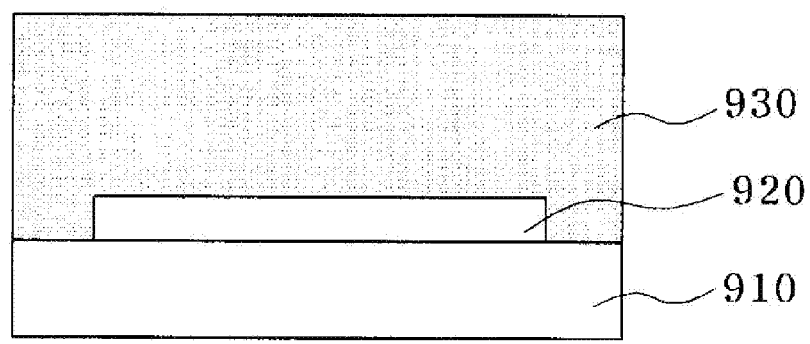

Referring to FIGS. 10A and 10B, photoresist 930 is formed on at least a portion of surfaces of the substrate 910 and the target object 920. FIGS. 10A and 10B are a plan view and cross-sectional view, respectively. The cross-sectional view of FIG. 10B is taken along line X-X' of the plan view of FIG. 10A. For clarity, a method of coating a target object will now be described using the photoresist 930 formed on at least the partial region of the substrate 910 and the surface of one target object 920. FIG. 10A illustrates, for example, that the target object 920 is a semiconductor chip having a surface on which contact pads 922A, 922B, 922C, and 922D required for a contact with a bonding wire are formed. In another example, when a semiconductor chip that does not need a contact pad required for a contact with a bonding wire is used as the target object 920, the contact pads 922A, 922B, 922C, and 922D may be omitted.

Referring to FIGS. 10A and 10B, the photoresist 930 may be formed on the substrate 910 and at least the partial region of the surface of the target object 920 using a coating process typically used in semiconductor processing. The photoresist 930 may be formed using various methods described with reference to FIGS. 5A through 5C. Also, the thickness of the photoresist 930 may be controlled using the methods described above with reference to FIGS. 5A through 5C.

Since the material and properties of the photoresist 930 are substantially the same as those of the photoresist described above with reference to FIG. 1, a detailed description thereof will be omitted for brevity.

Figure 11A:
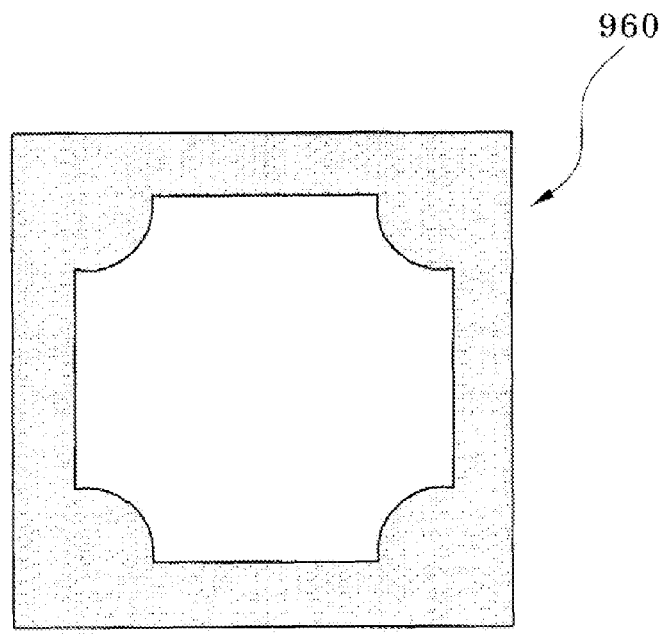
Figure 11B:
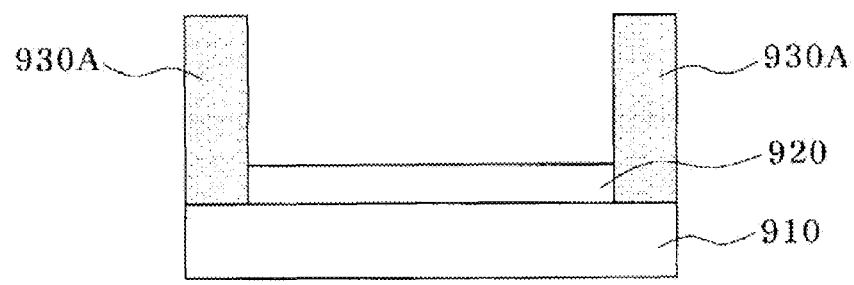

Referring to FIGS. 11A and 11B, an image of a target object 920 is processed to form a perimeter wall 930A for a coating layer of the target object 920.

FIG. 11A illustrates an optical pattern 960 required to form the perimeter wall 930A. Referring to FIG. 11A, the optical pattern 960 for the coating layer of the target object 920 may be determined by processing the image of the target object 920. For example, the optical pattern 960 may be obtained by processing the image of the target object 920 using the processor 140 described above with reference to FIGS. 1 and 2. Since the process of obtaining the optical pattern 960 is substantially the same as the process of obtaining the optical pattern 460 described above with reference to FIGS. 6A through 6C, a detailed description thereof will be omitted for brevity.

FIG. 11B is a cross-sectional view of the perimeter wall 930A formed using the optical pattern 960. The perimeter wall 930A corresponds to cured photoresist 930. The perimeter wall 930A may be formed by providing light having the determined optical pattern to a substrate 910. For example, the determined optical light pattern may be the same shape as the optical light pattern 960. In another example, the determined optical light pattern may be a light pattern that is the inverse of the optical pattern 960. FIG. 11B illustrates, for example, the perimeter wall 930A formed using the determined optical pattern whose shape is the inverse of the optical pattern 960. Also, FIG. 11B illustrates, for example, that the perimeter wall 930A is disposed on the contact pads 922A, 922B, 922C, and 922D and contacts lateral surfaces of the target object 920. In other embodiments, the shape and arrangement of the perimeter wall 930A may vary according to the shape of the coating layer of the target object 920 to be formed. The perimeter wall 930A having various shapes and arrangements may be obtained by varying the shape of the determined optical pattern. Since the process of providing the determined optical pattern to the substrate 910 is substantially the same as the process of providing the optical pattern 460 to the substrate 410 described above with reference to FIGS. 6A through 6C, a detailed description thereof will be omitted for brevity.

Figure 12:
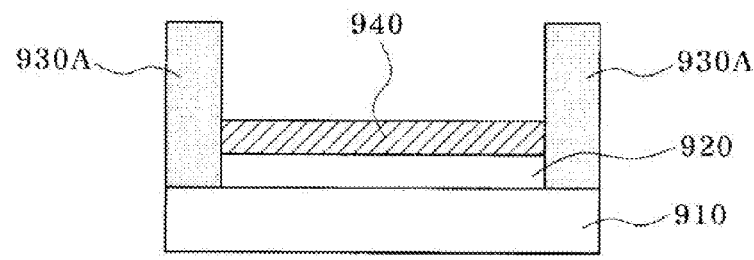

Referring to FIG. 12, resin 940 is provided to at least a portion of surfaces of the substrate 910 and the target object 920, which are surrounded by the perimeter wall 930A. Various kinds of resins may be used as the resin 940. For example, the resin 940 may be a mixture of water, ethanol, and thermosetting silicon. In another example, the resin 940 may be a mixture of water, ethanol, and epoxy. In yet another example, the resin 940 may be a mixture of water, ethanol, thermosetting silicon, and epoxy. In one embodiment, the resin 940 may include a phosphor. Various phosphors described above with reference to FIG. 1 may be used as the phosphor.

Figure 13:
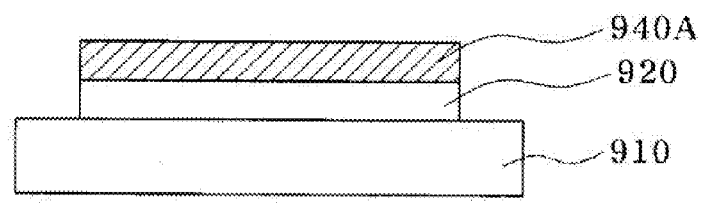

Referring to FIG. 13, the perimeter wall 940A is removed to obtain the target object 920 having the surface on which the coating layer 940A is formed. The coating layer 940A corresponds to the cured resin 940. The resin 940 may be cured using various methods. For example, the resin 940 may be thermally cured at room temperature or a predetermined temperature. The thickness of the coating layer 940A may be controlled by adjusting the amount of the resin 940 provided to at least the partial region of the surfaces of the substrate 910 and the target object 920 surrounded by the perimeter wall 930A, or a composition ratio of the mixture of the resin 940. The perimeter wall 940A may be removed using various methods typically used to remove photoresist. A method of removing the perimeter wall 940A may include, for example, a dry process, a wet process, or a thermal reflow process. The dry process may employ, for example, oxygen (O) plasma. In other embodiments, an additional coating layer (not shown) may be further formed between the coating layer 940A and the surface of the target object 920. The additional coating layer may be formed using, for example, the above-described method, and have various shapes and arrangements. For example, each of the additional coating layer and the coating layer 940A may include a phosphor layer. When an LED chip is used as the target object 920, the coating layer 940A and the additional coating layer, each of which includes the phosphor layer, may embody light having various colors or white light having various color temperatures. In another example, the additional coating layer may serve as a protection layer. The protection layer may form an appropriate space between the target object 920 and the coating layer 940A. When the LED chip is used as the target object 920 and a phosphor layer is used as the coating layer 940A, the space may function to protect the coating layer 940A from the influence of high heat generated by the LED chip.

Figure 14:
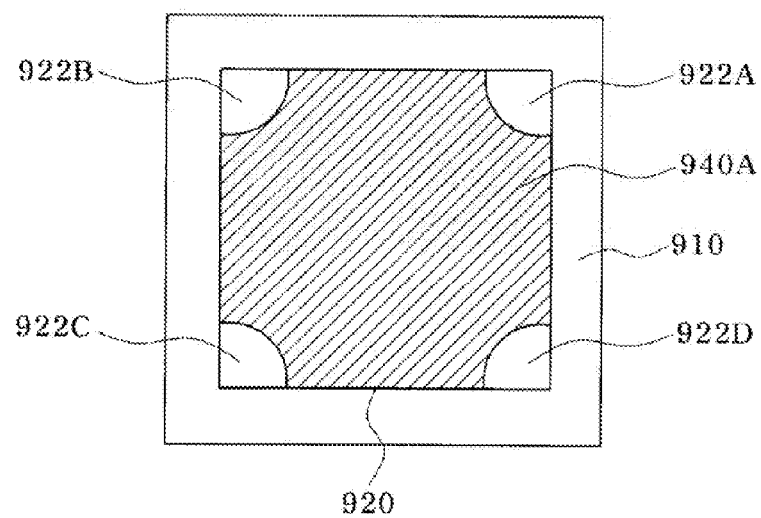
FIG. 14 is a diagram of a target object including a coating layer formed using the method of coating a target object described above with reference to FIGS. 9(A) through 13.

FIG. 14 is a diagram of the target object 920 including the coating layer 940A formed using the method of coating a target object described above with reference to FIGS. 9A through 13. The coating layer 940A is formed on the surface of the target object 920 using the method of coating a target object described above with reference to FIGS. 9A through 13. Partial regions for the contact pads 922A, 922B, 922C, and 922D of a top surface of the target object 920, which are required for the contact with the bonding wire, may not be covered with the coating layer 940A. In other embodiments, when the top surface of the target object 920 does not need to contact the bonding wire, the coating layer 940A may be formed on the partial regions 922A, 922B, 922C, and 922D required for the contact with the bonding wire. The coating layer 940A may be thermally cured. A coating layer cured by light (e.g., UV light) may exhibit nonuniform coating characteristics on sidewalls because scattering of light occurs due to a phosphor and a light intensity is reduced. However, when the coating layer 940A is thermally cured, nonuniform coating characteristics of the coating layer 940A formed on sidewalls may be reduced.

Hereinafter, a method and system for coating a chip using a flexible substrate according to the above-described exemplary embodiment of the present disclosure will be disclosed.

Figure 15:
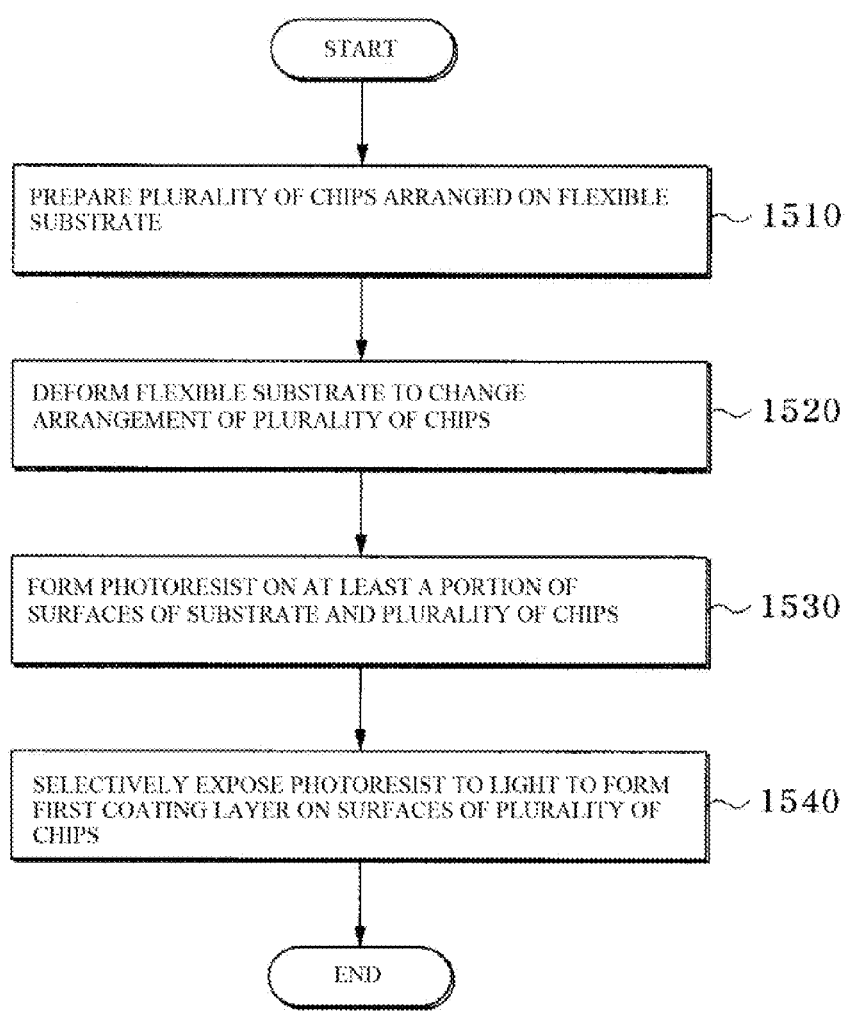
FIG. 15 is a flowchart illustrating a method of coating a chip according to an exemplary embodiment.

FIG. 15 is a flowchart illustrating a method of coating a chip according to an exemplary embodiment. Referring to FIG. 15, the method of coating the chip starts from block 1510. In block 1510, a plurality of chips disposed on a flexible substrate are prepared. The chips have a first arrangement on the substrate. For example, the plurality of chips disposed on the flexible substrate may be obtained by dicing a semiconductor wafer disposed on the flexible substrate. In this case, the plurality of chips are formed on the semiconductor wafer using a semiconductor process. In another example, the plurality of chips disposed on the flexible substrate may be obtained by disposing chips fabricated using various methods, such as a semiconductor process, on the flexible substrate. Various kinds of substrates may be used as the flexible substrate. The flexible substrate may be, for example, a plastic substrate, a plastic film, or a flexible PCB. In one embodiment, an adhesive material may be formed on one surface of the flexible substrate. The plurality of chips may be adhered to the one surface of the flexible substrate. In one embodiment, an adhesive material may be formed on one surface of the flexible substrate. The plurality of chips may be adhered to the one surface of the flexible substrate. In one embodiment, the plurality of chips adhered to the one surface of the flexible substrate may be obtained by adhering a semiconductor wafer to the one surface of the flexible substrate and dicing the semiconductor wafer. In this case, the plurality of chips are fabricated on the semiconductor wafer using a semiconductor process. The flexible substrate having the one surface on which the adhesive material is formed may be, for example, a dicing film. Various chips may be used as the plurality of chips. For instance, the plurality of chips may be microchips. The microchip may be a chip having an area of less than 1 mm². The microchip may have a size of, for example, 10 μm×10 μm×20 μm. In another example, each of the plurality chips may be a chip selected from the group consisting of an LED chip, an RFID chip, a CMOS chip, and a combination thereof. The chip selected from the microchip, the LED chip, the RFID chip, the CMOS chip, and a combination thereof may be fabricated on the semiconductor wafer using a semiconductor process.

In block 1520, arrangement of the plurality of chips may be changed by deforming the flexible substrate. Due to the deformation of the flexible substrate, the arrangement of the plurality of chips may be changed from the first arrangement to the second arrangement. The flexible substrate may be deformed using various methods. In one embodiment, the flexible substrate may be stretched by applying tensile force in at least one selected from an X-direction, a Y-direction, and a combination thereof. In other embodiments, the flexible substrate may be compressed by applying compressive force in at least one selected from the X-direction, the Y-direction, and a combination thereof. The compressive force may be not only externally applied compressive force but also restoring force of the flexible substrate. The restoring force may correspond to the tensile strength applied to the flexible substrate. In addition to these examples, the flexible substrate may be deformed using various other methods.

In block 1530, photoresist is formed on at least a portion of surfaces of the substrate and the plurality of chips. Various kinds of photoresists may be used as the photoresist. The photoresist may be a positive resist or a negative resist. For example, the photoresist may not include a phosphor. In this case, the cured photoresist may be, for example, a transparent layer or a molding layer. In another example, the photoresist may include a phosphor. In this case, the cured photoresist may be, for example, a phosphor layer. Various kinds of phosphors may be used as the phosphor. For example, the phosphor may be selected from a red phosphor, a green phosphor, a blue phosphor, a yellow phosphor, and a combination thereof. When LED chips are used as the plurality of chips, light having various colors or white light having various color temperatures may be embodied by controlling an optical wavelength and light intensity of the LED chips and the kind and concentration of the phosphor. The color temperature indicates that the color change of emitted light, which is shown depending on temperature, is stated in the unit of absolute temperature, Kelvin (K), based on the white color.

In block 1540, the photoresist is selectively exposed to light to form a first coating layer on the surfaces of the plurality of chips. The first coating layer is the cured photoresist. In one embodiment, the formation of the first coating layer may include selectively exposing the photoresist to light using a photomask to form the first coating layer. In other embodiments, the formation of the first coating layer may include selectively exposing the photoresist to light using a lithography system capable of programming an optical pattern without a photomask to form the first coating layer. Various methods may be used as a method of forming the first coating layer without a photomask. In one embodiment, the method of forming the first coating layer without the photomask may include capturing an image of the plurality of chips coated with the photoresist, determining a shape of light appropriate for the first coating layer based on the captured image of the plurality of chips, and providing the light having the determined shape to the photoresist.

In other embodiments, the processes of blocks 1530 and 1540 are repeatedly performed. In this case, an additional first coating layer may be further formed on the at least a portion of the surfaces of the plurality of chips or the first coating layer. In other embodiments, the method of coating the chip may be performed before the process of coating the photoresist (block 1530) and further include forming a second coating layer on at least a portion of surfaces of the plurality of chips. In this case, the method of coating the chip may be performed after the formation of the second coating layer and further include selectively etching the second coating layer to form a pattern. In this case, the coating layer formed using the processes described with reference to blocks 1530 and 1540 may be used as an etching mask required for selectively etching the second coating layer. The etching of the second coating layer may be a dry etching or wet etching process typically used in semiconductor processing. Various materials may be used for the second coating layer. For example, the second coating layer may be a conductive layer. In another example, the second coating layer may be an insulating layer. Below, a method of coating a chip according to an exemplary embodiment will be described with reference to FIGS. 16A through 22B.

FIGS. 16A through 22B are diagrams illustrating respective processes in a method of coating a chip according to an exemplary embodiment.

Figure 16A:
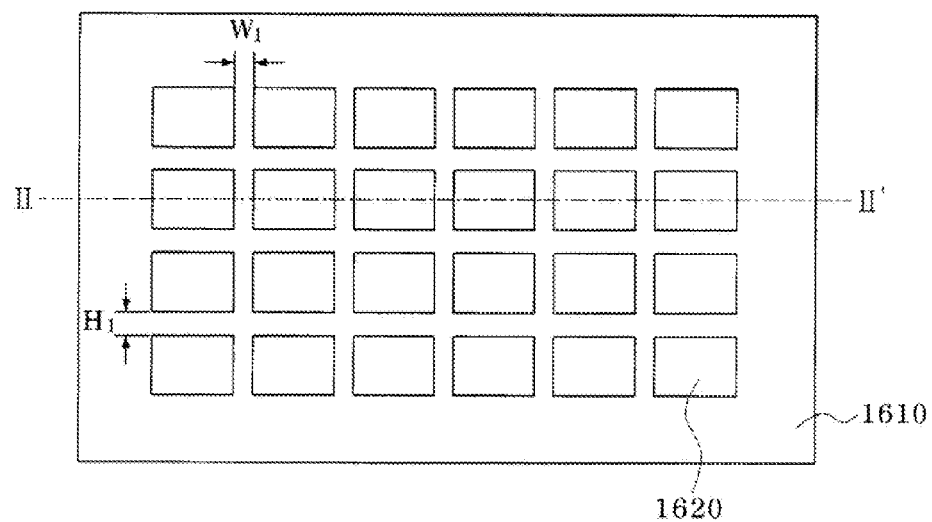
FIGS. 16A through 22B are diagrams illustrating respective processes in a method of coating a chip according to an exemplary embodiment.
Figure 16B:
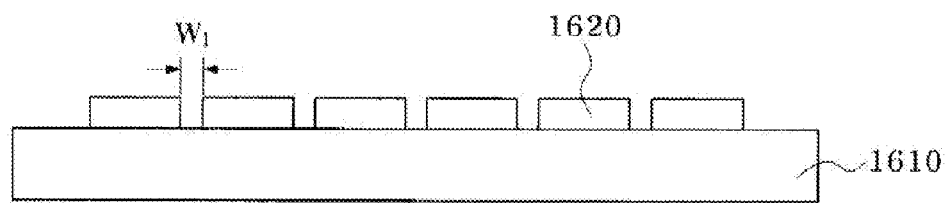

Referring to FIGS. 16A and 16B, to begin with, a plurality of chips 1620 disposed on a flexible substrate 1610 are prepared. FIGS. 16A and 16B are a plan view and a cross-sectional view, respectively. The cross-sectional view of FIG. 16B is taken along line II-II' of the plan view of FIG. 16A.

Since the flexible substrate 1610 is substantially the same as the flexible substrate described above with reference to block 1510 of FIG. 15, a detailed description thereof will be omitted for brevity.

The plurality of chips 1620 are disposed on the flexible substrate 1610. The plurality of chips 1620 have a first arrangement on the flexible substrate 1610. FIG. 16A illustrates a plurality of chips 1620 arranged on the flexible substrate 1610 at horizontal intervals $W_1$ and vertical intervals $H_1$. In other embodiments, at least two of the plurality of chips 1620 may be disposed at different horizontal intervals or different vertical intervals. Since the plurality of chips 1620 are substantially the same as the plurality of chips described with reference to block 1610 of FIG. 15, a detailed description thereof will be omitted for brevity.

Figure 17A:
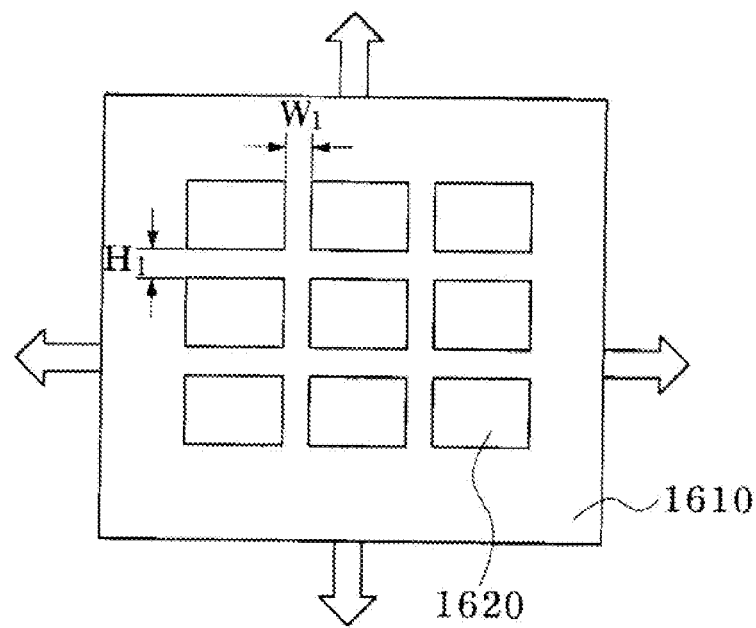
Figure 17B:
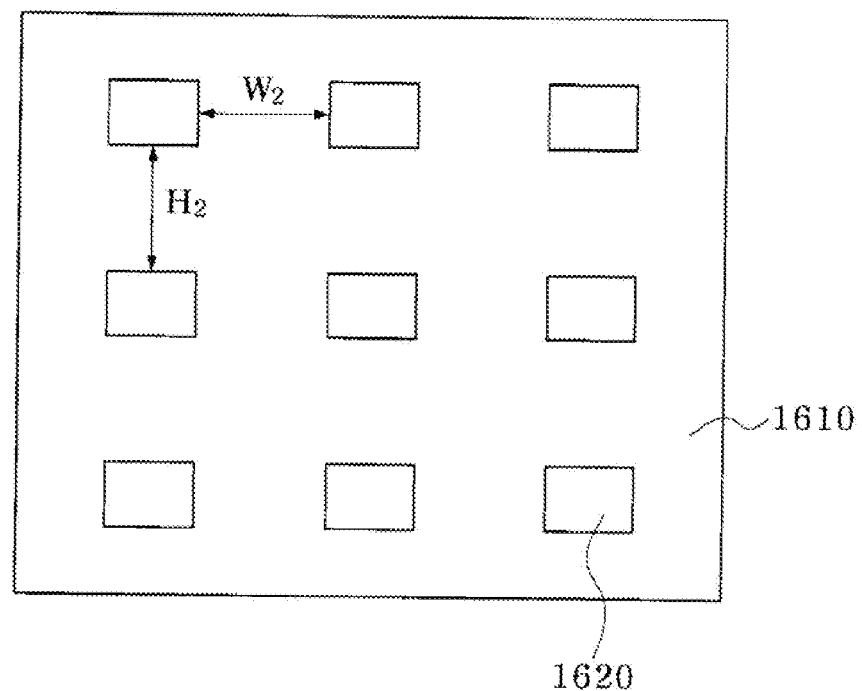

Referring to FIGS. 17A and 17B, the flexible substrate 1610 is deformed to change the arrangement of the plurality of chips 1620. FIG. 17A illustrates tensile force applied to the flexible substrate 1610. FIG. 17B illustrates the plurality of chips 1620 whose arrangement is changed due to the tensile force. The first arrangement of the plurality of chips 1620 is converted into the second arrangement due to the deformation of the flexible substrate 1610. The flexible substrate 1610 may be deformed using various methods described with reference to block 1520 of FIG. 15. Since the method of deforming the flexible substrate 1610 is substantially the same as the method described with reference to block 1520 of FIG. 15, a detailed description thereof will be omitted for brevity. FIGS. 17A and 17B illustrate a plurality of chips 1620 arranged at horizontal intervals $W_2$ and vertical intervals $H_2$ due to the tensile force applied to the flexible substrate 1610 in X- and Y-directions. In other embodiments, tensile force may be applied to the flexible substrate 1610 in either one of the X- and Y-directions. In other embodiments, at least two of the plurality of chips 1620 may be disposed at different horizontal intervals or vertical intervals.

Figure 18A:
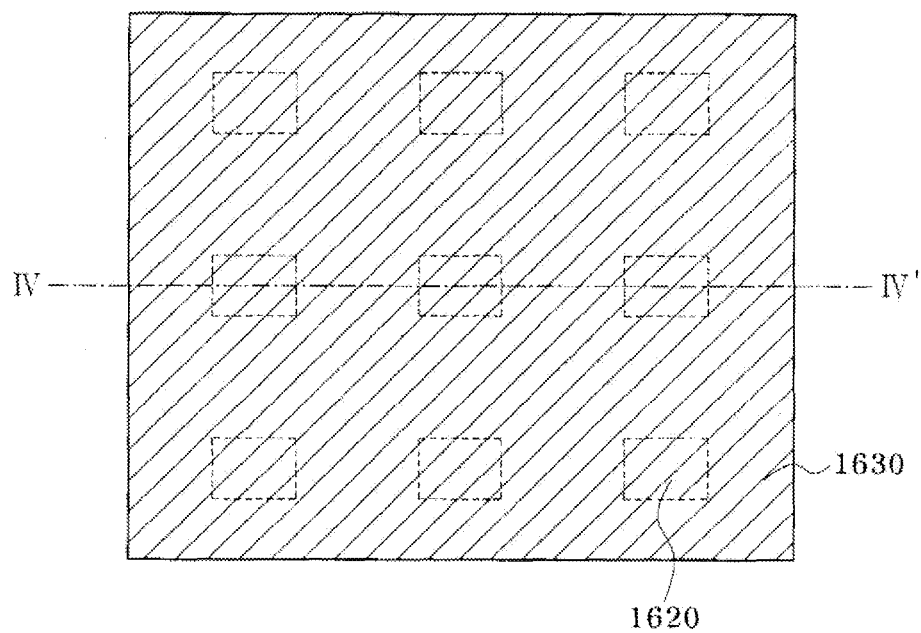
Figure 18B:
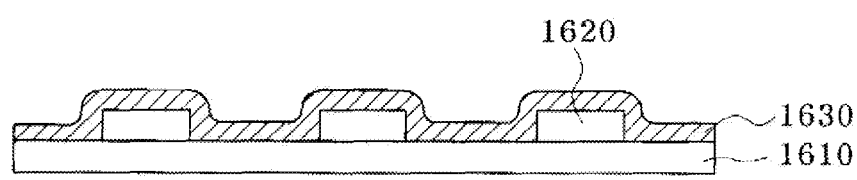

Referring to FIGS. 18A and 18B, photoresist 1630 is formed on at least a portion of surfaces of the flexible substrate 1610 and the plurality of chips 1620. FIGS. 18A and 18B are a plan view and a cross-sectional view, respectively. The cross-sectional view of FIG. 18B is taken along line IV-IV' of the plan view of FIG. 18A. Since the photoresist 1630 is substantially the same as the photoresist described with reference to block 1530 of FIG. 15, a detailed description thereof will be omitted for brevity. FIGS. 18A and 18B illustrate that the photoresist 1630 surrounds all surfaces of the flexible substrate 1610 and the plurality of chips 1620 except interfaces between the flexible substrate 1610 and the plurality of chips 1620. In other embodiments, the photoresist 1630 may be formed on the flexible substrate 1610 and partial regions of the surfaces of the plurality of chips 1620. The photoresist 1630 may be formed on at least a portion of the surfaces of the flexible substrate 1610 and the the plurality of chips 1620 using various methods. For example, the photoresist 1630 may be formed on the at least a portion of the surfaces of the flexible substrate 1610 and the plurality of chips 1620 using a spin coating process or a spray coating process. In addition to these examples, the photoresist 1630 may be formed using various other methods.

Figure 19A:
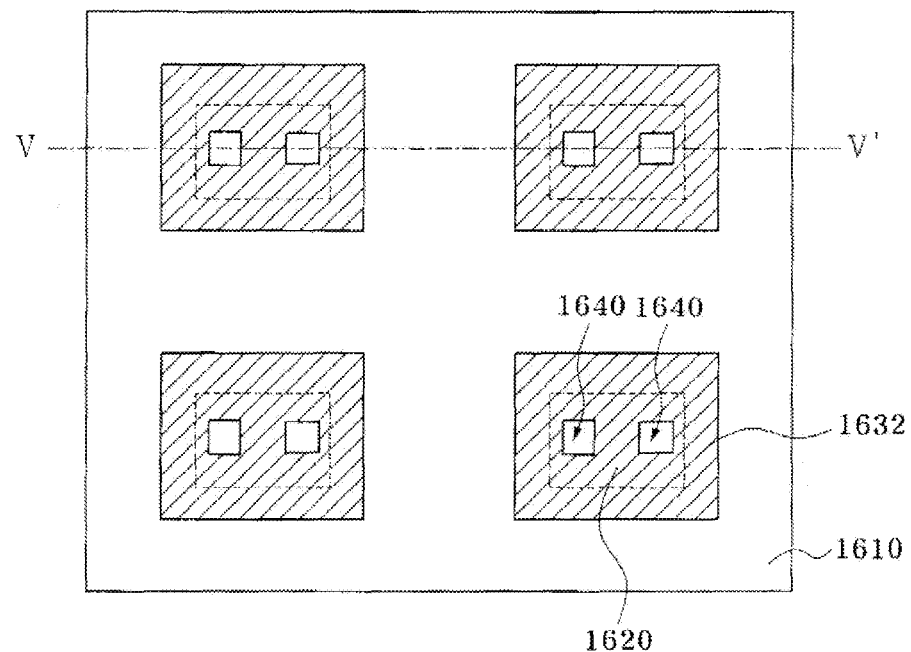
Figure 19B:
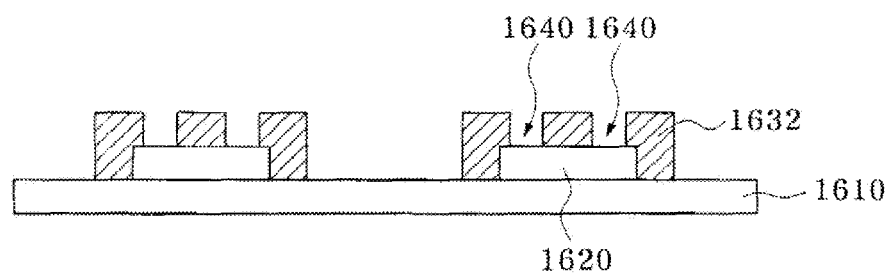

Referring to FIGS. 19A and 19B, the photoresist is selectively exposed to light 1630 to form a first coating layer 1632 on the surfaces of the plurality of chips 1620. FIGS. 19A and 19B are a plan view and a cross-sectional view, respectively. The cross-sectional view of FIG. 19B is taken along line V-V of the plan view of FIG. 19A. The first coating layer 1632 is the cured photoresist 1630. A partial region 1640 of a top surface of each of the plurality of chips 1620, which is required for a contact with a bonding wire, may not be covered with the first coating layer 1632. FIG. 19A illustrates, for example, that the partial region 1640 required for the contact with the bonding wire includes two regions having the same shape. In other embodiments, the partial region 1640 required for the contact with the bonding wire may be provided in various other numbers or shapes.

FIGS. 20A through 21B are diagrams illustrating the process of forming the first coating layer 1632 on the surfaces of the plurality of chips 1620 by selectively exposing the photoresist to light 1630 described with reference to FIGS. 19A and 19B.

Figure 20A:
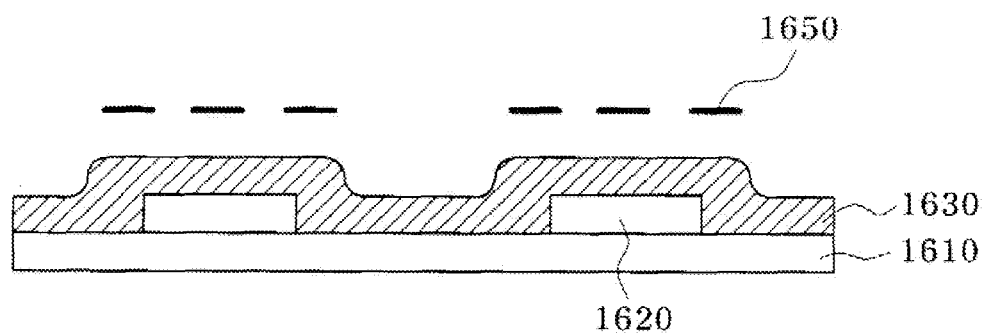
Figure 20B:
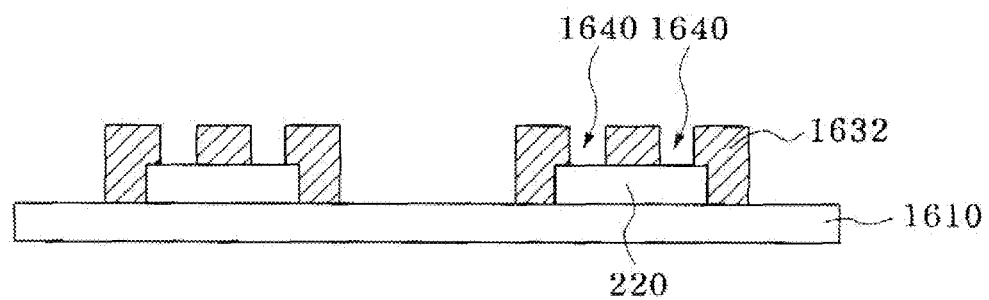

FIGS. 20A and 20B are diagrams illustrating a process of forming the first coating layer 1632 on the surfaces of the plurality of chips 1620 by selectively exposing the photoresist to light 1630 using a photomask 1650.

Referring to FIG. 20A, the flexible substrate 1610 and the plurality of chips 1620 on which the photoresist 1630 are formed are prepared. As described above with reference to FIGS. 18A and 18B, the photoresist 1630 may be formed on the at least a portion of the surfaces of the flexible substrate 1610 and the plurality of chips 1620. The photoresist is selectively exposed to light 1630 using the photomask 1650. Various kinds of light may be used as the light. The light may be, for example, UV light.

Referring to FIG. 20B, the photoresist 1630 selectively exposed to light by the photomask 1650 is developed to form a first coating layer 1632 on the surfaces of the plurality of chips 1620. The first coating layer 1632 may undergo a baking process to achieve stabilization. The first coating layer 1632 may correspond to the cured photoresist 1630. A partial region 1640 of a top surface of each of the plurality of chips 1620, which is required for a contact with a bonding wire, may not be covered with the first coating layer 1632. In other embodiments, when the top surface of each of the plurality of chips 1620 does not need to contact the bonding wire, the partial region 1640 required for the contact with the bonding wire may be replaced by the first coating layer 1632.

Referring back to FIGS. 20A and 20B, positive resist is used, for example, as the photoresist 1630. In other embodiments, negative resist may be used as the photoresist 1630. In this case, a masking pattern of the photomask 1650 may be the inverse of that shown in FIG. 20A.

Figure 21A:
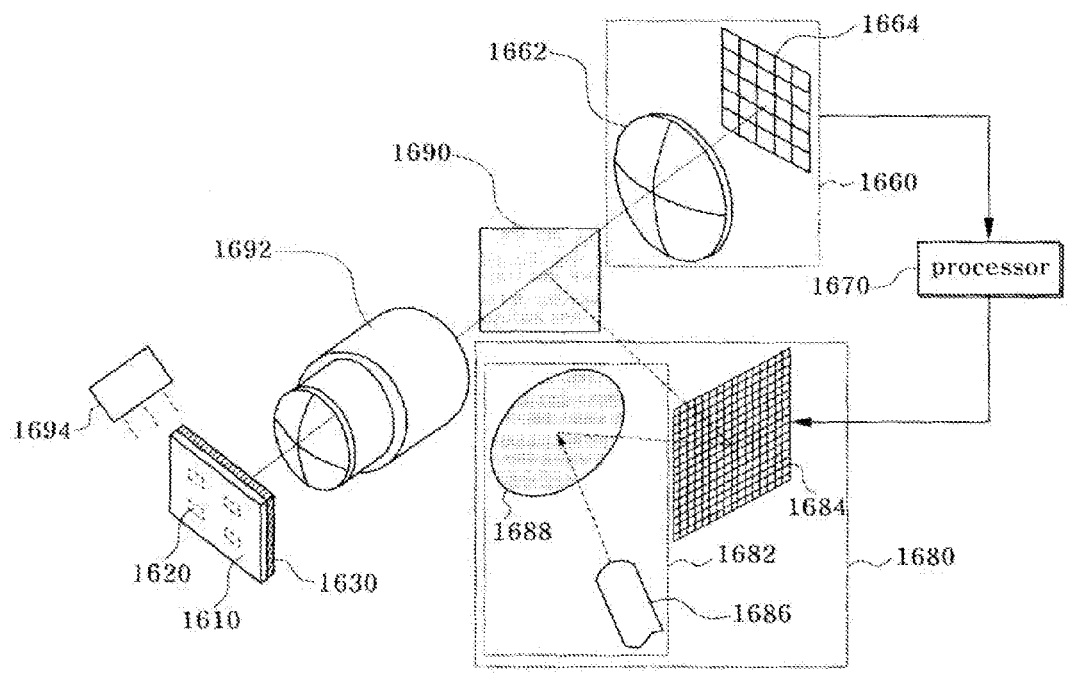
Figure 21B:
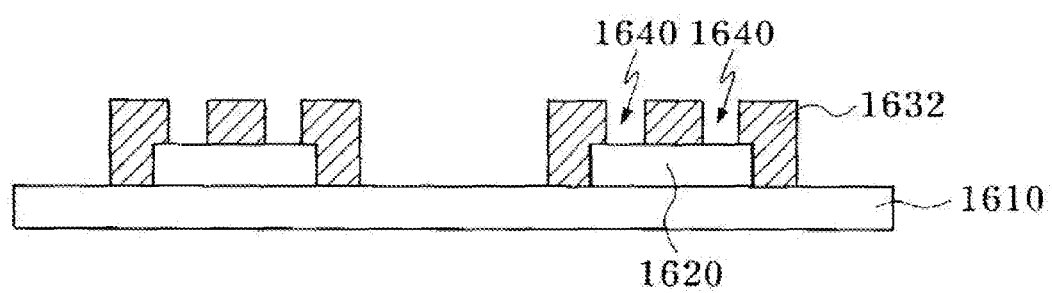

FIGS. 21A and 21B are diagrams illustrating a process of forming a first coating layer 1632 on the surfaces of the plurality of chips 1620 by selectively exposing the photoresist 1630 to light using a lithography system capable of programming an optical pattern without a photomask.

Referring to FIG. 21A, a flexible substrate 1610 and a plurality of chips 1620 on which the photoresist 1630 is formed are prepared. As described above with reference to FIGS. 18A and 18B, the photoresist 1630 may be formed on at least a portion of the surfaces of the flexible substrate 1610 and the plurality of chips 1620. The photoresist 1630 is selectively exposed to light using the lithography system.

The lithography system may include a camera 1660, a processor 1670, and a light projection apparatus 1680. In other embodiments, the lithography system may optionally further include a beam splitter 1690, a demagnification lens 1692, and an illuminator 1694.

The camera 1660 captures an image of the plurality of chips 1620 disposed on the flexible substrate 1610. The camera 1660 provides an electric signal corresponding to the captured image to the processor 1670. For example, the camera 1660 may include an imaging lens 1662 and an image sensor 1664. The image lens 1662 receives light from the beam splitter 1690, transmits the light to the image sensor 1664, and functions to enable formation of an image on the image sensor 1664. The image sensor 1664 functions to generate the electric signal corresponding to incident light.

The processor 1670 determines a shape of light appropriate for forming the first coating layer 1632 based on the image captured by the camera 1660. The processor 1670 may be, for example, a personal computer (PC) or a notebook.

The light projection apparatus 1680 may provide the light having the determined shape to the flexible substrate 1610. The light projection apparatus 1680 may include, for example, a light source 1682 and a spatial light modulator 1684. The light source 1682 may be, for example, a UV light source or a visible light source. For instance, the light source 1682 may include a UV light source collimator 1686 and a UV filter 1688. The UV light source collimator 1686 functions to output collimated UV light. The UV light source collimator 1686 may include, for example, a 200 W UV lamp (not shown) and a fiber-based light guiding system (not shown). The UV filter 1688 functions to selectively pass UV light from the UV light source collimator 1686 to the spatial light modulator 1684. The spatial light modulator 1684 functions to modulate light emmitted by the light source 1682 in response to a signal provided by the processor 1670. The spatial light modulator 1684 may be, for example, a digital micromirror array fabricated as a 2-dimensional array as shown in FIG. 21A. Alternatively, the spatial light modulator 1684 may be fabricated as a 1-dimensional array or fabricated using techniques other than a micromirror technique (e.g., an LCD technique). A light modulation operation of the spatial light modulator 1684 may be programmed. That is, the spatial light modulator 1684 may optionally transmit light incident on a desired pixel of the spatial light modulator 1684 to the flexible substrate 1610 at a desired time.

The demagnification lens 1692 functions to demagnify light provided by the exposure system 1680 and provide the demagnified light to the flexible substrate 1610. A microscopic object lens having various magnifications of 2×, 4×, 10×, 20×, 40×, and 60× may be used as the demagnification lens 1692. For example, a 10× microscopic object lens may be used as the demagnification lens 1692 to project an image of the light projection apparatus 1680 on a final object plane with a demagnification factor of about 5.

The beam splitter 1690 functions to transmit the modulated light provided by the light projection apparatus 1680 through the demagnification lens 1692 to the flexible substrate 1610. Also, the beam splitter 1690 functions to transmit an image, which is transmitted from the flexible substrate 1610 through the demagnification lens 1692, to the camera 1660. For example, the beam splitter 1690 may be a half-mirror as shown in FIG. 21A.

The illuminator 1694 functions to provide illumination so that the camera 1660 can obtain the image of the flexible substrate 1610. Since there is only a small difference in refractive index between cured photoresist 1632 and uncured photoresist 1630, off-axis illumination is preferably used to show the cured photoresist 1632.

Referring to FIG. 21B, the photoresist 1630 selectively exposed to light by the lithography system is developed to form a first coating layer 1632 on surfaces of the plurality of chips 1630. The first coating layer 1632 may undergo a baking process to achieve stabilization. The first coating layer 1632 may correspond to the cured photoresist 1630. A partial region 1640 of a top surface of each of the plurality of chips 1620, which is required for a contact with a bonding wire, may not be covered with the first coating layer 1632. In other embodiments, when the top surface of each of the plurality of chips 1620 does not need to contact the bonding wire, the partial region 1640 required for the contact with the bonding wire may be replaced by the first coating layer 1632.

Referring back to FIGS. 21A and 21B, positive resist is used, for example, as the photoresist 1630. In other embodiments, negative resist may be used as the photoresist 1630. In this case, an optical masking pattern provided by the lithography system may be the inverse of a pattern shown in FIG. 21A.

Figure 22A:
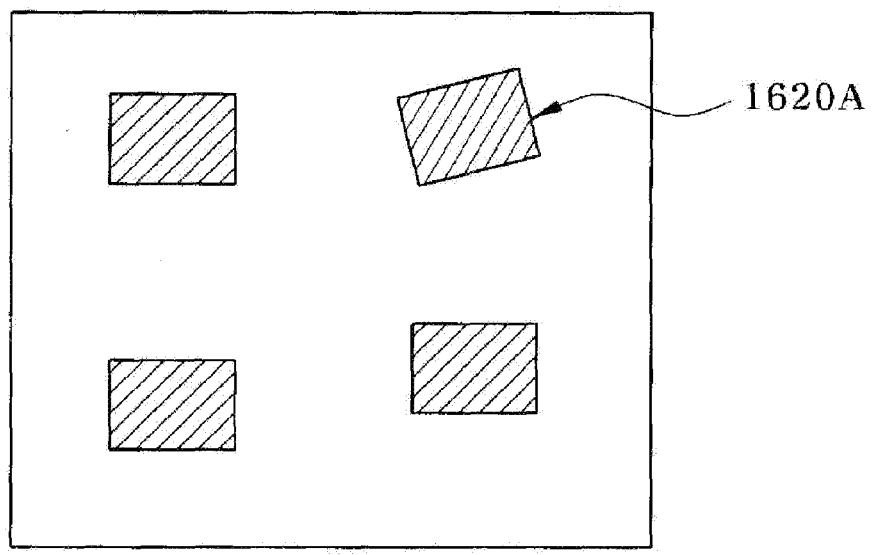
Figure 22B:
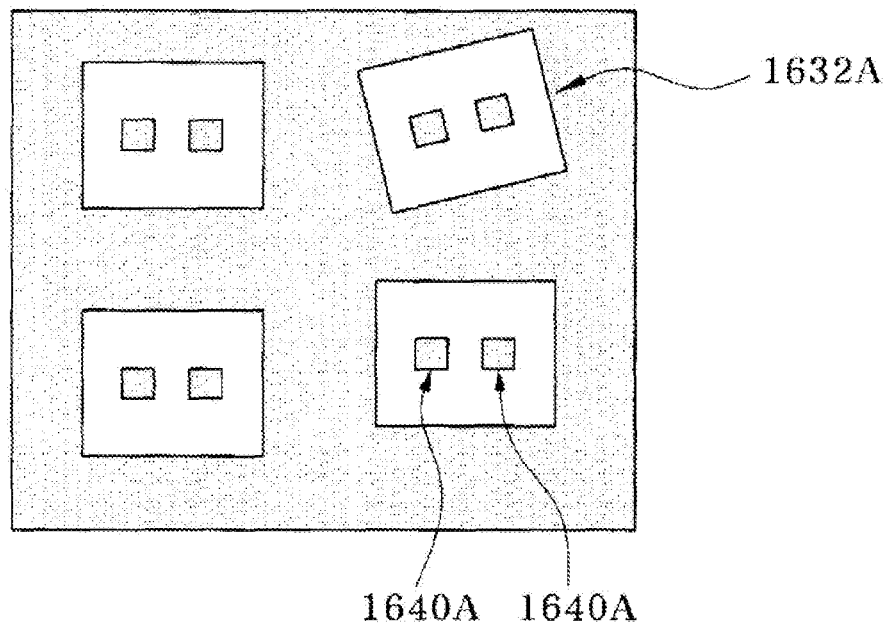

FIGS. 22A and 22B are diagrams illustrating an operation of the processor 1670 described with reference to FIGS. 21A and 21B. FIG. 22A is a diagram of the captured image of the plurality of chips 1620, which is provided to the processor 1670, and FIG. 22B is a diagram of the shape of light appropriate for the first coating layer 1632, which is determined by the processor 1670. Referring to FIGS. 22A and 22B, the processor 1670 may use a shape 1632A obtained by expanding a region 1620A corresponding to each of the plurality of chips 1620 within a predetermined range as the shape of light appropriate for the first coating layer 1632.

Figure 23A:
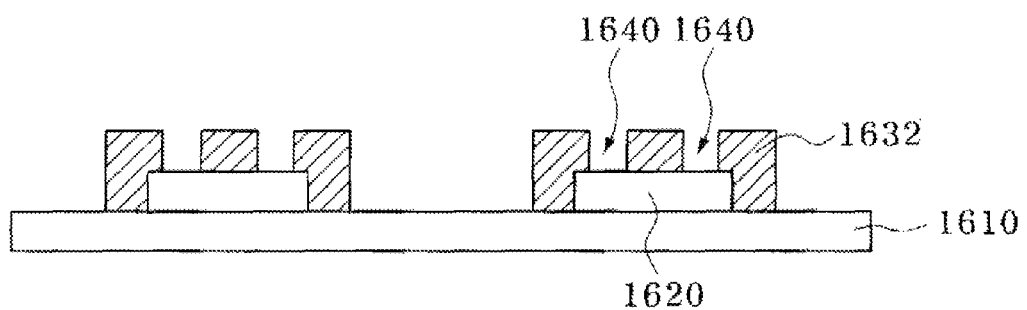
FIGS. 23A and 23B are diagrams of a plurality of chips including a coating layer formed using the method of coating a chip described above with reference to FIGS. 15A through 22B.
Figure 23B:
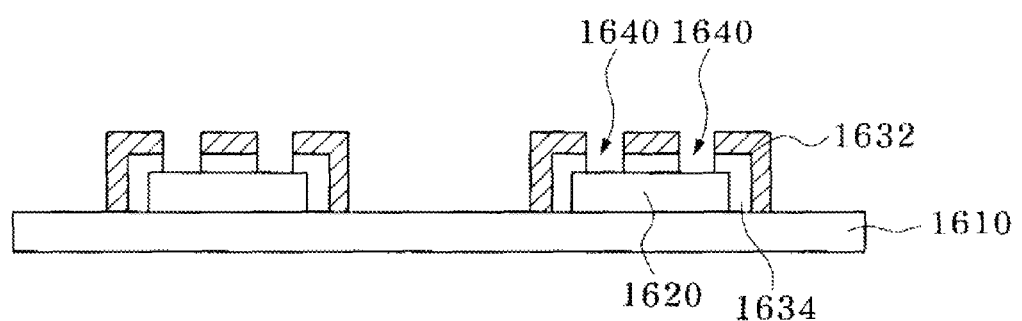

FIGS. 23A and 23B are cross-sectional views of the plurality of chips including the coating layer formed using the method of coating a chip described above with reference to FIGS. 15A through 22B.

FIG. 23A illustrates the plurality of chips 1620 having the surfaces on which the first coating layer 1632 is formed using the above-described method. The partial region 1640 of the top surface of each of the plurality of chips 1620, which is required for the contact with the bonding wire, may not be covered with the first coating layer 1632. The first coating layer 1632 corresponds to cured photoresist. For example, the first coating layer 1632 may not include a phosphor. In this case, the first coating layer 1632 may be, for example, a phosphor layer. When LED chips are used as the plurality of chips, light having various colors or white light having various color temperatures may be embodied by controlling an optical wavelength and light intensity of the LED chips and the kind and concentration of the phosphor.

FIG. 23B illustrates the plurality of chips 1620 having the surfaces on which the first coating layer 1632 and the second coating layer 1634 are formed using the above-described method of coating the chip. The partial region 1640 of the top surface of each of the plurality of chips 1620, which is required for the contact with the bonding wire, may not be covered with the first and second coating layers 1632 and 1634. For example, the second coating layer 1634 may be a conductive layer. In another example, the second coating layer 1634 may be an insulating layer.

FIG. 23B illustrates, for example, that the second coating layer 1634 is the cured photoresist formed using the above-described method of coating the chip. For example, the second coating layer 1634 may include a phosphor. In this case, the second coating layer 1634 may be, for example, a phosphor layer. When LED chips are used as the plurality of chips 1620, the second coating layer 1634 including the phosphor may embody light having various colors or white light having various color temperatures along with the first coating layer 1632 including the phosphor. In another example, the second coating layer 1634 may not include a phosphor. In this case, the second coating layer 1634 may serve as, for example, a protection layer. The protection layer may form an appropriate space between the plurality of chips 1620 and the second coating layer 1634. When LED chips are used as the plurality of chips 1620 and a phosphor layer is used as the first coating layer 1632, the space may function to protect the second coating layer 1634 from the influence of high heat generated by the LED chip.

In other embodiments, the second coating layer 1634 may be a coating layer patterned using the above-described method of coating a chip. Alternatively, the second coating layer 1634 may have various shapes or functions. For example, the second coating layer 1634 may be an interconnection line required for electrical connection. In another example, the second coating layer 1634 may be a contact pad required for the contact with the bonding wire. In addition to these examples, the second coating layer 1634 may have various other shapes or functions. The method of coating a chip may be performed after the formation of the coating layer, and the second coating layer 1634 may be formed by selectively etching the coating layer using a pattern formed using the method of coating the chip. The formation of the second coating layer 1634 by selectively etching the coating layer may be performed using various methods. Since the methods of forming the second coating layer 1634 are apparent to those skilled in the art, a detailed description thereof will be omitted for brevity. The pattern corresponds to cured photoresist obtained using the method of coating the chip. For example, the coating layer may be a conductive layer. In other embodiments, the coating layer may be an insulating layer. The coating layer may be formed on at least a portion of the surface of each of the plurality of chips 1620 using various methods. For example, the coating layer may be formed on at least the partial region of the surface of each of the plurality of chips 1620 using a spin coating process, a spray coating process, or a printing process. In another case, the coating layer may be formed on at least the partial region of the surface of each of the plurality of chips 1620 using a PVD process, a CVD process, or an electroplating process. In addition to these examples, the coating layer may be formed using various other methods.

Referring back to FIGS. 16A through 23B, the flexible substrate 1610 may be deformed to change the arrangement of the plurality of chips 1620 disposed on the flexible substrate 1610. The deformation may occur due to tensile force applied to the flexible substrate 1610. Due to the tensile force, an interval between the plurality of chips 1620 disposed on the flexible substrate 1610 may be increased. As a result, a sufficient space for coating the plurality of chips 1620 disposed on the flexible substrate 1610 may be ensured. In one embodiment, the plurality of chips 1620 disposed on the flexible substrate 1610 may be obtained by dicing a semiconductor wafer disposed on the flexible substrate 1610. In this case, an interval between the plurality of chips 1620 may be too small to form a coating layer on the surfaces of the plurality of chips 1620. According to the method of the present disclosure, when the interval between the plurality of chips 1620 is too small to form the coating layer, it is unnecessary to redistribute the plurality of chips 1620 at sufficient intervals. By applying the tensile force to the flexible substrate 1610, the interval between the plurality of chips 1620 may be controlled to a sufficient value to form the coating layer. Accordingly, the process of redistributing the plurality of chips 1620 using a pick-and-place technique to ensure the space for the coating layer may be omitted. As a result, a cost-effective packaging process may be enabled. Furthermore, since the flexible substrate 1610 may be easily bent, the plurality of chips 1620 may be easily assembled in a circuit substrate or an IC package having various surface relief patterns or step differences.

Figure 24:
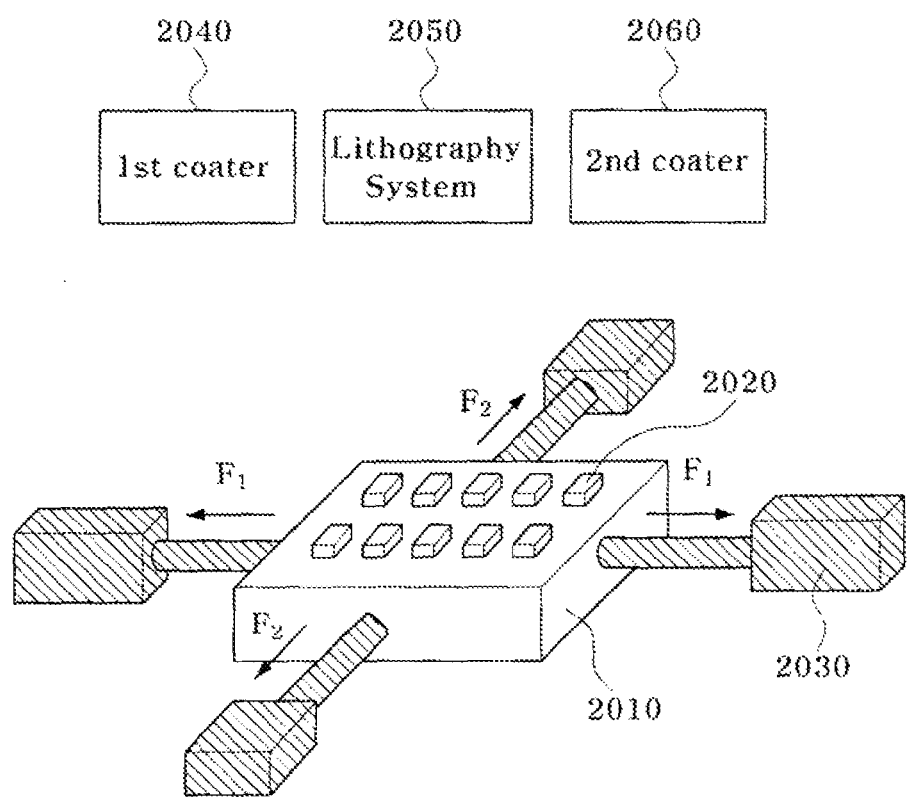
FIG. 24 is a diagram of a chip coating system according to an exemplary embodiment.

FIG. 24 is a diagram of a chip coating system according to an exemplary embodiment. Referring to FIG. 24, the chip coating system includes a flexible substrate 2010, a plurality of chips 2020, a fixture 2030, a first coater 2040, and a lithography system 2050. In other embodiments, the chip coating system may optionally further include a second coater 2060.

A plurality of chips 2020 having a first arrangement may be disposed on one surface of the flexible substrate 2010. Since the flexible substrate 2010 and the plurality of chips 2020 are substantially the same as the flexible substrate 1610 and the plurality of chips 1620 described above with reference to FIGS. 15 through 23B, a detailed description thereof will be omitted for brevity.

The fixture 2030 may be connected to the flexible substrate 2010 and deform the flexible substrate 2010 to convert the first arrangement of the plurality of chips 2020 into a second arrangement. In one embodiment, the fixture 2030 may stretch or compress the flexible substrate 2010 in at least one direction selected from an X-direction, a Y-direction, and a combination thereof to convert the first arrangement into the second arrangement. FIG. 24 illustrates that tensile forces $F_1$ and $F_2$ are applied to the flexible substrate 2010 in the X- and Y-directions, respectively, to convert the first arrangement into the second arrangement. In other embodiments, tensile force may be applied to the flexible substrate 2010 in either one of the X- and Y-directions. In addition to these examples, the flexible substrate 2010 may be deformed using various other methods. Various apparatuses may be used as the fixture 2030. The fixture 2030 may be, for example, a tension apparatus or a compression apparatus. The fixture 2030 may further include a controller (not shown) configured to detect the arrangement of the plurality of chips 2020 and control a degree of deformation of the flexible substrate 2010. For example, the controller may further include a sensor configured to detect the arrangement of the plurality of chips 2020 and a processor configured to feed a signal of the sensor back and determine the degree of deformation of the flexible substrate 2010.

The first coater 2040 may form photoresist (not shown) on at least a portion of the surfaces of the flexible substrate 2010 and the plurality of chips 2020. Various apparatuses may be used as the first coater 2040. The first coater 2040 may be, for example, a spin coater or a spray coater. In addition to these examples, various other apparatuses may be used as the first coater 2040. Since the photoresist is substantially the same as the photoresist 1630 described with reference to FIGS. 15 through 23B, a detailed description thereof will be omitted for brevity.

The lithography system 2050 may selectively expose the photoresist to light to form a coating layer (not shown) on the surfaces of the plurality of chips 2020. The coating layer is the cured photoresist. For example, the lithography system 2050 may be a lithography system using a photomask or a maskless lithography system. Since the lithography system 2050 using the photomask is a typical apparatus used in a semiconductor process and apparent to those skilled in the art, a detailed description thereof will be omitted for brevity. Since the maskless lithography system 1050 is substantially the same as the lithography system described with reference to FIGS. 7A and 7B, a detailed description thereof will be omitted for brevity.

The second coater 2060 may form a conductive layer or an insulating layer on the at least a portion of the surfaces of the flexible substrate 2010 and the plurality of chips 2020. Various apparatuses may be used as the second coater 2060. The second coater 2060 may be, for example, a spin coater, a spray coater, a PVD apparatus, a CVD apparatus, or an electroplating apparatus. In addition to these examples, various other apparatuses may be used as the second coater 2060. In other embodiments, when only the photoresist is used, the second coater 2060 may be omitted.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A lithography system comprising:
an illuminator configured to provide a first light to at least one target object disposed on a substrate to form an image of the at least one target object;
a processor configured to process the image formed by the first light provided by the illuminator and determine an optical pattern for a coating layer of the at least one target object based on the processing of the image formed by the first light provided by the illuminator;
a coater configured to supply a photoresist to at least a portion of surfaces of the substrate and the target object; and
an exposure apparatus configured to provide the optical pattern determined by the processor to the substrate,
wherein the exposure apparatus comprises:
a light source; and
a spatial light modulator configured to modulate a second light provided by the light source in response to a signal corresponding to the optical pattern provided by the processor.

2. The system of claim 1, wherein the photoresist contains a phosphor.

3. The system of claim 1, further comprising a beam splitter configured to transmit the second light modulated by the exposure apparatus to the substrate and to transmit the image formed by the first light provided by the illuminator to the processor.

4. The system of claim 1, wherein the coater is selected from a group consisting of a spin coater, a spray coater, and a microfluidic channel.

5. The system of claim 1, further comprising a second coater configured to form a conductive layer or an insulating layer on at least a portion of the surfaces of the substrate and the target object.

6. The system of claim 5, wherein the second coater is selected from a group consisting of a physical vapor deposition apparatus, chemical vapor deposition apparatus, and an electroplating apparatus.

7. The system of claim 1, wherein the at least one target object comprises a light emitting device.

8. A method of coating a target object, comprising:
preparing a substrate having a surface on which at least one target object is disposed;
providing, by a first light source, a first light to the at least one target object;
capturing, by a camera, an image of the at least one target object formed by the first light and providing an electric signal corresponding to the captured image to a processor;
determining, by the processor, an optical pattern for a coating layer of the at least one target object by processing the image of the at least one target object formed by the first light;
supplying, by a coater, a photoresist onto at least a portion of surfaces of the substrate and the at least one target object; and
providing, by a second light source, a second light having the determined optical pattern to the substrate so as to form the photoresist into the coating layer having a shape of the optical pattern.

9. The method of claim 8,
wherein the photoresist contains a phosphor, and
wherein the photoresist is selectively cured by the second light having the determined optical pattern.

10. The method of claim 9, further comprising forming an additional coating layer on at least a portion of the at least one target object before supplying the photoresist.

11. The method of claim 8, wherein the second light having the determined optical pattern is transmitted to the substrate by a beam splitter and the image of the at least one target object formed by the first light is transmitted to the processor by the beam splitter.

12. The method of claim 8, further comprising: forming a conductive layer or an insulating layer, by a second coater, on at least the portion of the surfaces of the substrate and the target object.

13. The method of claim 8, wherein the photoresist comprises a phosphor and the at least one target object is a light emitting device.

14. A method of coating a target object, comprising:
preparing a substrate having one surface on which at least one target object is disposed;
forming photoresist on at least a portion of surfaces of the substrate and the at least one target object;
forming a perimeter wall on each target object by processing an image of the at least one target object, the perimeter wall surrounding each target object; and
coating each target object by providing a resin to an inside of the perimeter wall surrounding each target object.

15. The method of claim 14, wherein the resin contains a phosphor.

16. The method of claim 14, wherein forming the perimeter wall comprises:
obtaining the image of the at least one target object; and
providing light having an optical pattern corresponding to the perimeter wall to the substrate using the obtained image of the at least one target object.

* * * * *